United States Patent
Kim et al.

(10) Patent No.: US 9,773,908 B2
(45) Date of Patent: Sep. 26, 2017

(54) SEMICONDUCTOR DEVICES INCLUDING FIN BODIES WITH VARIED EPITAXIAL LAYERS

(71) Applicant: Samsung Electronics Co., Ltd., Suwon-si, Gyeonggi-do (KR)

(72) Inventors: Dongwoo Kim, Incheon (KR); Seunghun Lee, Hwaseong-si (KR); Sunjung Kim, Suwon-si (KR); Hyunjung Lee, Suwon-si (KR); Bonyoung Koo, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 18 days.

(21) Appl. No.: 15/138,914

(22) Filed: Apr. 26, 2016

(65) Prior Publication Data

US 2016/0315193 A1 Oct. 27, 2016

(30) Foreign Application Priority Data

Apr. 27, 2015 (KR) ........................ 10-2015-0059166

(51) Int. Cl.
*H01L 21/02* (2006.01)
*H01L 29/78* (2006.01)
*H01L 29/08* (2006.01)
*H01L 29/165* (2006.01)

(52) U.S. Cl.
CPC ...... *H01L 29/7848* (2013.01); *H01L 29/0847* (2013.01); *H01L 29/7853* (2013.01); *H01L 29/165* (2013.01)

(58) Field of Classification Search
CPC ........................ H01L 27/0886; H01L 27/0924
See application file for complete search history.

(56) References Cited

U.S. PATENT DOCUMENTS

| | | | |
|---|---|---|---|
| 7,525,160 B2 | 4/2009 | Kavalieros et al. | |
| 7,915,693 B2 | 3/2011 | Okano | |
| 8,012,858 B2 | 9/2011 | Murano et al. | |
| 8,263,451 B2 | 9/2012 | Su et al. | |
| 8,362,574 B2 | 1/2013 | Kawasaki et al. | |
| 8,871,554 B2 | 10/2014 | Hill et al. | |
| 8,906,768 B2 | 12/2014 | Wong et al. | |
| 2007/0075372 A1 | 4/2007 | Terashima et al. | |
| 2013/0075797 A1 | 3/2013 | Okano | |
| 2014/0217362 A1 | 8/2014 | Ma et al. | |
| 2015/0270401 A1* | 9/2015 | Huang | H01L 29/7851 257/192 |

FOREIGN PATENT DOCUMENTS

JP 2012-231168 A 11/2012

\* cited by examiner

*Primary Examiner* — Elias M Ullah
(74) *Attorney, Agent, or Firm* — Ward and Smith, P.A.

(57) ABSTRACT

A semiconductor device can include a substrate and a fin body that protrudes from a surface of the substrate. The fin body can include a lower portion having a first lattice structure and an upper portion, separated from the lower portion by a boundary, the upper portion having a second lattice structure that is different than the first lattice structure. An epitaxially grown epitxial layer can be on the lower and upper portions.

17 Claims, 32 Drawing Sheets

ND FIN BODIES WITH VARIED EPITAXIAL
SEMICONDUCTOR DEVICES INCLUDING FIN BODIES WITH VARIED EPITAXIAL LAYERS

CROSS-REFERENCE TO RELATED APPLICATION

This application claims priority under 35 U.S.C. §119 to Korean Patent Application No. 10-2015-0059166 filed on Apr. 27, 2015, the disclosure of which is hereby incorporated by reference in its entirety.

FIELD

Embodiments of the inventive concept relate to semiconductor devices including a fin body with an epitaxial layer.

BACKGROUND

Semiconductor devices, such as fin field effect transistors (FinFETs) can include fin shaped bodies and epitaxial layers grown thereon. The epitaxial layer may cover an upper portion of the fin body. The epitaxial layer may be formed on a surface of the fin body by a selective epitaxial growth (SEG) process. Electrical characteristics of the semiconductor devices may be affected by electrical characteristics of the fin bodies. For example, the electrical characteristics of the semiconductor devices may be affected by the electron mobility of the fin bodies.

SUMMARY

Embodiments of the inventive concept can provide semiconductor devices including fin bodies with varied epitaxial layers. Pursuant to these embodiments, a semiconductor device can include a fin body that protrudes from a substrate and an isolation layer on the substrate that covers a lower portion of the fin body and exposes an upper portion of the fin body. An epitaxial layer can cover the upper portion of the fin body, wherein the epitaxial layer has a surface profile including an hourglass neck shape.

In some embodiments, a semiconductor device can include a fin body including a lower body portion and an upper body portion having respective lattice structures that are different from one another. An epitaxial layer can be on the fin body, where the epitaxial layer includes a first side layer on a first side surface of the fin body. The first side layer can include a lower convex portion disposed on the lower body portion and facing outward from the first side surface, an upper convex portion disposed on the upper body portion and facing outward, and a concave portion disposed between the lower convex portion and the upper convex portion and facing outward.

In some embodiments, a semiconductor device can include a fin body that includes a body shoulder portion disposed on an upper sidewall surface of the fin body and an epitaxial layer that covers the body shoulder portion, wherein the epitaxial layer includes a concave portion facing outward from the fin body adjacent to the body shoulder portion of the fin body.

In some embodiments, a semiconductor device can include a substrate and a fin body that protrudes from a surface of the substrate. The fin body can include a lower portion having a first lattice structure and an upper portion, separated from the lower portion by a boundary, the upper portion having a second lattice structure that is different than the first lattice structure. An epitaxially grown epitxial layer can be on the lower and upper portions.

BRIEF DESCRIPTION OF THE DRAWINGS

FIGS. 7 to 17, 18A to 23A, and 18B to 23B are views showing a method of forming a semiconductor device in accordance with embodiments of the inventive concept;

DETAILED DESCRIPTION OF THE EMBODIMENTS

Figure 1:
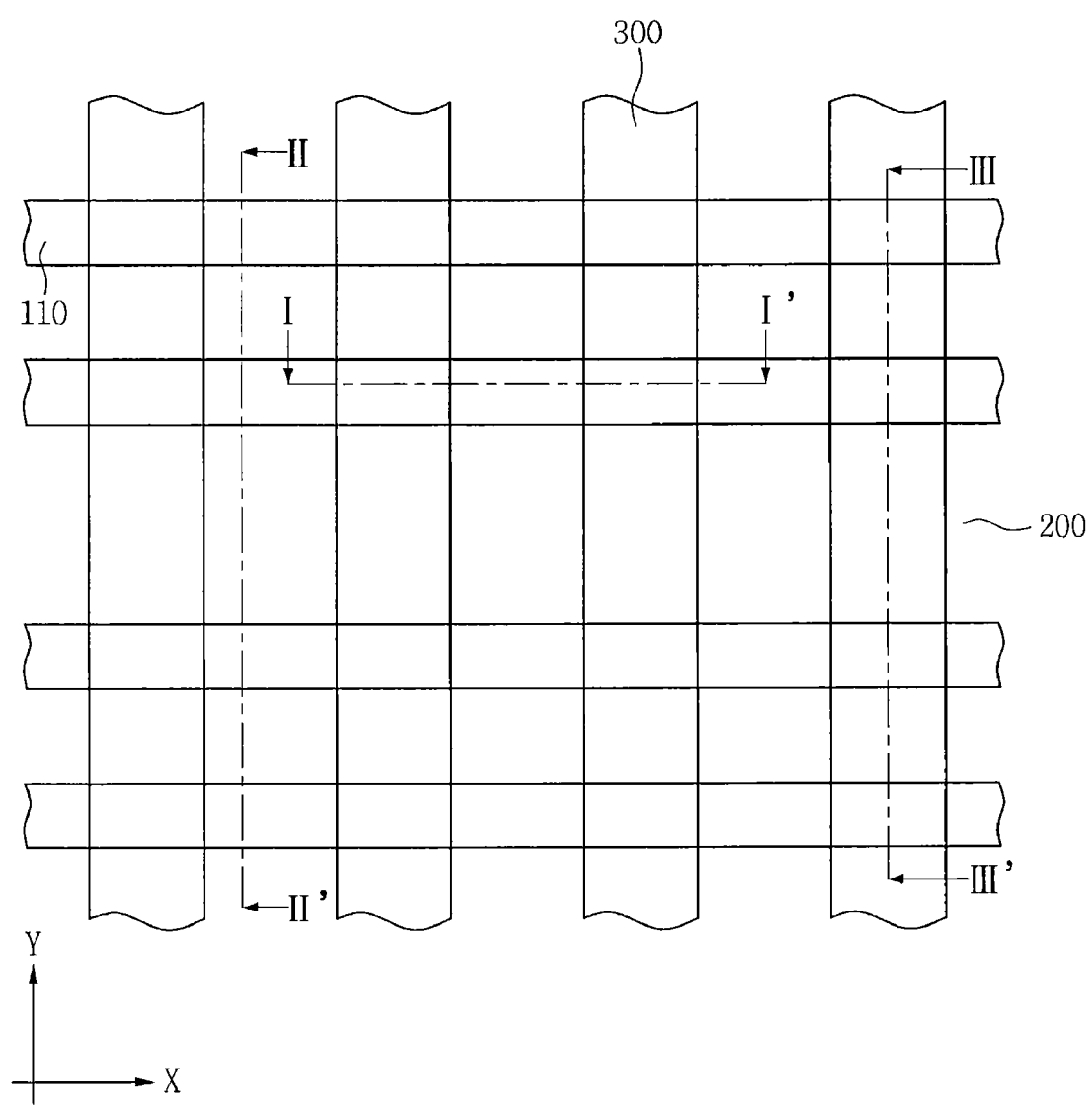
FIG. 1 is a plan view of a semiconductor device in accordance with embodiments of the inventive concept.

The inventive concepts are described hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts. In the drawings, embodiments of the inventive concepts are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on"

another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Figure 2A:
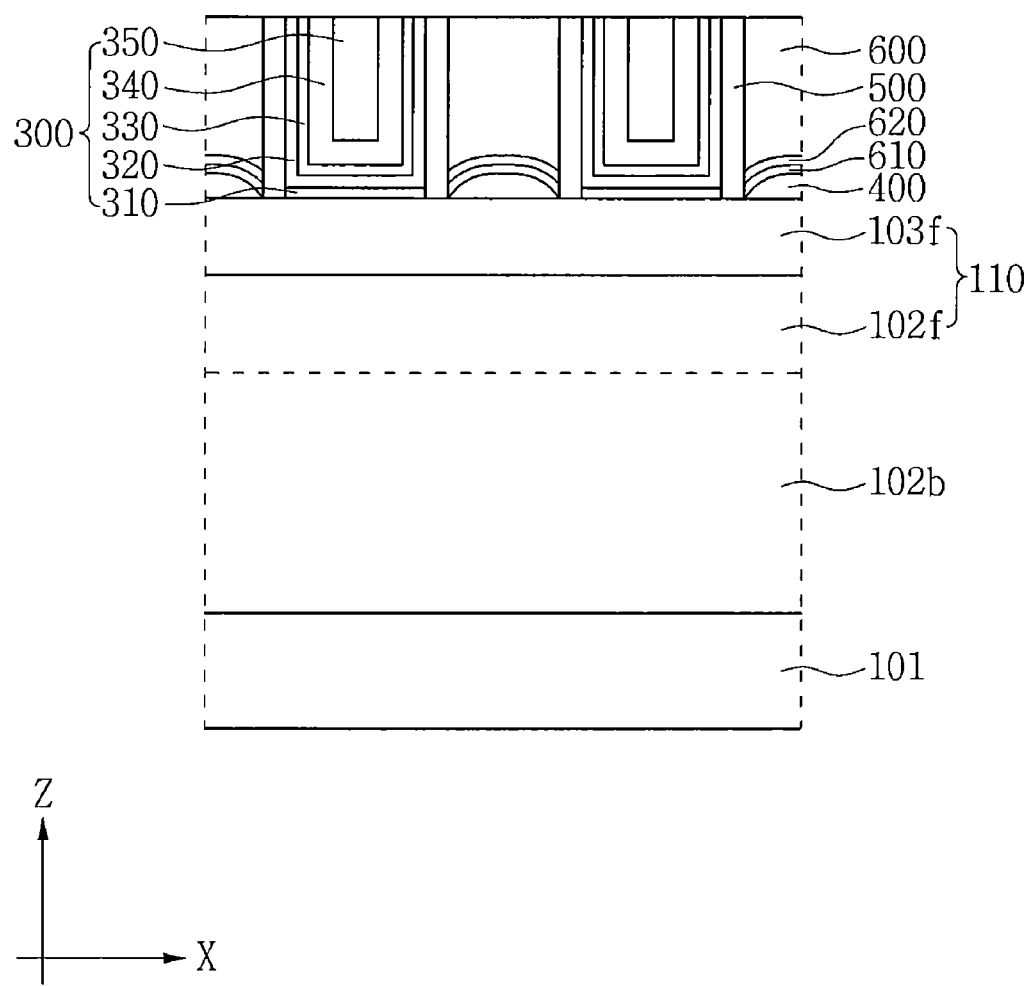
FIG. 2A is a cross-sectional view taken along line I-I' of FIG. 1.
Figure 2B:
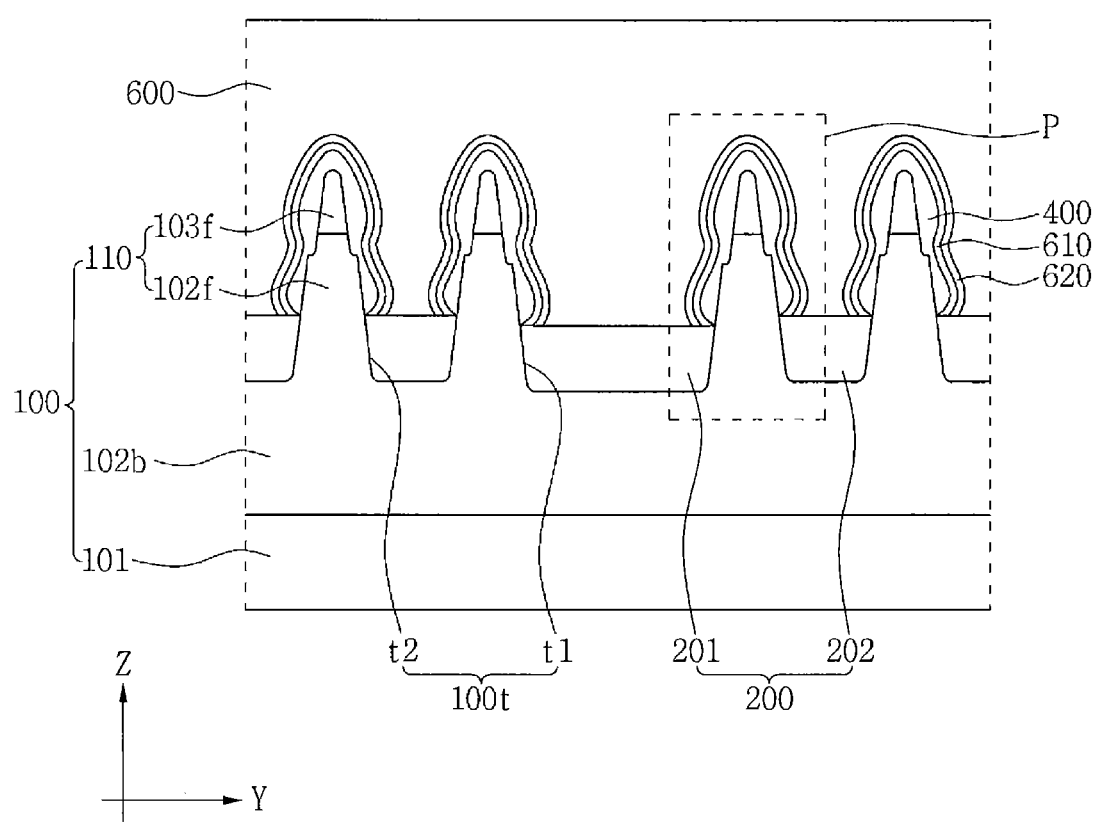
FIG. 2B is a cross-sectional view taken along line II-II' of FIG. 1.
Figure 2C:
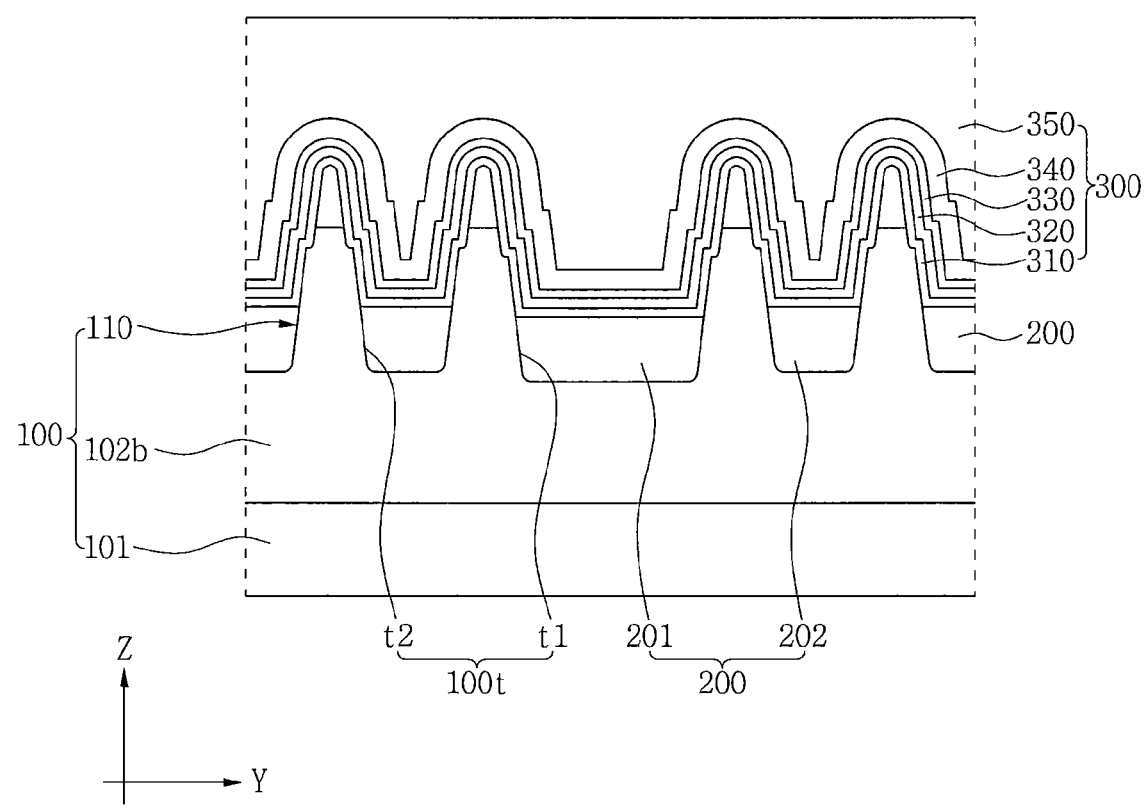
FIG. 2C is a cross-sectional view taken along line III-III' of FIG. 1.
Figure 3:
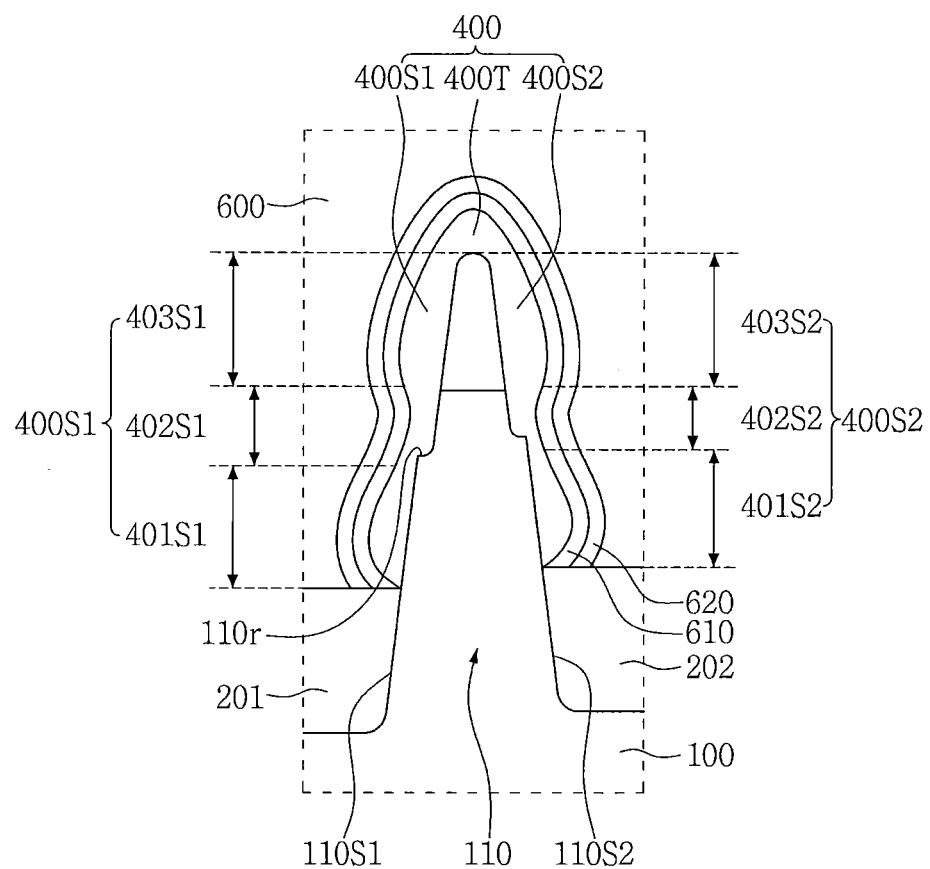
FIG. 3 is an enlarged view of a portion P of FIG. 2B.

FIG. 1 is a plan view of a semiconductor device in accordance with embodiments of the inventive concept. FIG. 2A is a cross-sectional view taken along line I-I' of FIG. 1. FIG. 2B is a cross-sectional view taken along line II-II' of FIG. 1. FIG. 2C is a cross-sectional view taken along line III-III' of FIG. 1. FIG. 3 is an enlarged view of a portion P of FIG. 2B.

Referring to FIGS. 1, 2A to 2C, and 3, the semiconductor device in accordance with the embodiment of the inventive concept may include a substrate 100, an isolation layer 200, gate assemblies 300, epitaxial layers 400, and an interlayer insulating layer 600.

The substrate 100 may include a base substrate 101, a lower stress relaxed buffer (lower SRB) layer 102b, and fin bodies 110.

The base substrate 101 may include a semiconductor wafer. For example, the base substrate 101 may include a single crystal silicon wafer.

The lower SRB layer 102b may be located on the base substrate 101. The lower SRB layer 102b may have a different lattice structure from the base substrate 101. For example, a unit cell of the lower SRB layer 102b may be larger than a unit cell of the base substrate 101. For example, the lower SRB layer 102b may include silicon germanium (SiGe).

The fin bodies 110 may be located on the lower SRB layer 102b. The fin bodies 110 may extend in a first direction X. Each of the fin bodies 110 may be parallel to the adjacent fin bodies 110.

Each of the fin bodies 110 may include a lower body portion 102f and an upper body portion 103f.

The lower body portion 102f may be located near the lower SRB layer 102b. The lower body portion 102f may have the same lattice structure as the lower SRB layer 102b. The lower body portion 102f may include the same material as the lower SRB layer 102b. For example, the lower body portion 102f may include silicon germanium (SiGe).

The lower body portion 102f may be materially connected to the lower SRB layer 102b. For example, the lower body portion 102f may not have a boundary separated from the lower SRB layer 102b so that the lower body portion 102f and the lower SRB layer 102b form a unitary structure.

The upper body portion 103f may be located on the lower body portion 102f. The upper body portion 103f may have a different lattice structure from the lower body portion 102f. For example, the unit cell of the upper body portion 103f may be smaller than the unit cell of the lower body portion 102f. For example, the upper body portion 103f may include silicon whereas the lower body portion 102f is SiGe.

In the semiconductor device in accordance with embodiments of the inventive concept, the fin body 110 includes the lower body portion 102f and the upper body portion 103f having different lattice structures. The upper body portion 103f is stressed due to an influence of the lower body portion 102f. For example, when the unit cell of the upper body portion 103f is smaller than the unit cell of the lower body portion 102f, tensile stress is applied to the upper body portion 103f and thus electron mobility of the upper body portion 103f may be increased. Therefore, in the semiconductor device in accordance with embodiments of the inventive concept, an electrical characteristic of the fin body 110 may be improved.

A body recessed portion 110r may be located on each of the fin bodies 110 near an interface between the upper body portion 103f and the lower body portion 102f. A lowermost level of the body recessed portion 110r may be lower than a level of a lower surface of the upper body portion 103f. A level of a boundary between the lower body portion 102f and the upper body portion 103f may be higher than the lowermost level of the body recessed portion 110r. In some embodiments, the body recessed portion 110r can take the form of a ledge in the fin body 110 where the cross-section diameter at the fin body 110 abruptly changes.

The substrate 100 may include trenches 100t located between the fin bodies 110. The fin bodies 110 may be defined by the trenches 100t. The trench 100t may be a first trench t1 or a second trench t2, each having different widths in the y-direction.

A shape of the second trench t2 may be different from a shape of the first trench t1. For example, a horizontal width (y-direction) of the second trench t2 may be less than a horizontal width of the first trench t1. The bottom of the second trench t2 may be higher than the bottom of the first trench t1.

Each of the fin bodies 110 may include a first side surface 110S1 facing the first trench t1 and a second side surface 110S2 facing the second trench t2 in the opposite direction. A lowermost level of the first side surface 110S1 may be the same as the level of the bottom of the first trench t1. A lowermost level of the second side surface 110S2 may be the same as the level of the bottom of the second trench t2. The lowermost level of the second side surface 110S2 may be higher than the lowermost level of the first side surface 110S1. A length of the second side surface 110S2 may be less than a length of the first side surface 110S1. The lowermost level of the body recessed portion 110r on the second side surface 110S2 may be higher than the lowermost level of the body recessed portion 110r on the first side surface 110S1. In other words, the height of the ledge 110r in the first side surface 110S1 may be below a corresponding portion of the ledge in the second side surface 110S2.

In the semiconductor device in accordance with embodiments of the inventive concept, some of the fin bodies 110 are located between the first trench t1 and the second trench t2, and the other fin bodies 110 are located between two of the second trenches t2. Therefore, in the semiconductor device in accordance with embodiments of the inventive concept, some of the fin bodies 110 may include the first side surface 110S1 and the second side surface 110S2, whereas both side surfaces of other fin bodies 110 may be as shown by the second side surface 110S2.

The isolation layer 200 may be located in the trenches 100t. The isolation layer 200 may surround lower portions of the fin bodies 110. A level of an upper surface of the isolation layer 200 may be lower than a level of an upper surface of the lower body portion 102f.

The isolation layer 200 may include an insulating material. For example, the isolation layer 200 may include silicon oxide (SiO).

The isolation layer 200 may include a first isolation layer 201 and a second isolation layer 202.

The first isolation layer 201 may be located in the first trench t1. The first isolation layer 201 may be located on a lower portion of the first side surface 110S1 of the fin body 110. For example, a level of an upper surface of the first isolation layer 201 may be lower than the lowermost level of the body recessed portion (or ledge) 110r in the first side surface 110S1.

The second isolation layer 202 may be located in the second trench t2. The second isolation layer 202 may be located on a lower portion of the second side surface 110S2 of the fin body 110. For example, a level of an upper surface of the second isolation layer 202 may be lower than the lowermost level of the body recessed portion (or ledge) 110r in the second side surface 110S2.

A horizontal width of the second isolation layer 202 may be less than a horizontal width of the first isolation layer 201. The level of the upper surface of the second isolation layer 202 may be different from the level of the upper surface of the first isolation layer 201. For example, the level of the upper surface of the second isolation layer 202 may be higher than the level of the upper surface of the first isolation layer 201.

The gate assemblies 300 may be located on the substrate 100 including the fin bodies 110. The gate assemblies 300 may extend in a second direction Y. The second direction Y may be perpendicular to the first direction X. The gate assemblies 300 may cross the fin bodies 110. For example, the fin bodies 110 may serve as channel regions.

Each of the gate assemblies 300 may include a surface insulating pattern 310, a gate insulating pattern 320, a barrier pattern 330, a lower gate electrode 340, and an upper gate electrode 350.

The surface insulating pattern 310 may be located on a surface of the fin body 110. The surface insulating pattern 310 may include an insulating material. For example, the surface insulating pattern 310 may include oxidized silicon.

The gate insulating pattern 320 may be located on the surface insulating pattern 310. The gate insulating pattern 320 may extend in the second direction Y. The gate insulating pattern 320 may cross the isolation layer 200.

The gate insulating pattern 320 may include an insulating material having a high dielectric constant. For example, the gate insulating pattern 320 may include a metal oxide. For example, the gate insulating pattern 320 may include hafnium oxide (HfO) or aluminum oxide (AlO).

The barrier pattern 330 may be located on the gate insulating pattern 320. The barrier pattern 330 may include a metal to provide a barrier. For example, the barrier pattern 330 may include titanium (Ti), titanium nitride (TiN), tantalum (Ta), tantalum nitride (TaN), or titanium tungsten (TiW).

The lower gate electrode 340 may be located on the barrier pattern 330. The lower gate electrode 340 may include a conductive material. For example, the lower gate electrode 340 may include titanium aluminum (TiAl), titanium nitride (TiN), or aluminum titanium oxide (AlTiO). The lower gate electrode 340 may have a multilayer structure.

The upper gate electrode 350 may be located on the lower gate electrode 340. The upper gate electrode 350 may include a conductive material more conductive than the lower gate electrode 340. For example, the upper gate electrode 350 may include a metal such as tungsten (W), copper (Cu), or the like.

Gate spacers 500 may be located on side surfaces of the gate assemblies 300. The gate spacers 500 may include an insulating material. For example, the gate spacers 500 may include silicon oxide (SiO) or silicon nitride (SiN). Each of the gate spacers 500 may have a multilayer structure.

The epitaxial layers 400 may be located between the gate assemblies 300. The epitaxial layers 400 may be located between the gate spacers 500. The epitaxial layers 400 may be located on the surfaces of the fin bodies 110 that protrude from the isolation layers 201 and 202.

The epitaxial layers 400 may cover upper portions of the fin bodies 110. The body recessed portion (or ledge) 110r of each of the fin bodies 110 may be covered by a corresponding epitaxial layer 400. For example, the epitaxial layers 400 may each serve as a source/drain region.

Each of the epitaxial layers 400 may include a first side epitaxial layer 400S1, a second side epitaxial layer 400S2, and an upper epitaxial layer 400T.

The first side epitaxial layer 400S1 may be located on the first side surface 110S1 of the fin body 110. A lowermost level of the first side epitaxial layer 400S1 may be lower than the lowermost level of the body recessed portion (or ledge) 110r on the first side surface 110S1. For example, the lowermost level of the first side epitaxial layer 400S1 may be the same as the level of the upper surface of the first isolation layer 201.

A surface profile of the first side epitaxial layer 400S 1 may have a curved irregular shape. For example, the surface profile of the first side epitaxial layer 400S1 may have a wave shape.

The first side epitaxial layer 400S1 may include a first lower convex portion 401S1, a first concave portion 402S1, and a first upper convex portion 403S1. Here, the first lower convex portion 401S1, the first concave portion 402S1, and the first upper convex portion 403S1 may be separated by inflection points on the surface profile of the first side epitaxial layer 400S1. For example, the first side epitaxial layer 400S1 may be divided into the first lower convex portion 401S1, the first concave portion 402S1, and the first upper convex portion 403S1 based on points in which curvature of the surface profile changes from convex to concave to convex.

The first lower convex portion 401S1 may be located on the first side surface 110S1 of the lower body portion 102f of the fin body 110. The first upper convex portion 403S1 may be located on the first side surface 110S1 of the upper body portion 103f of the fin body 110. The first concave portion 402S1 may be located between the first lower convex portion 401S1 and the first upper convex portion 403S1. For example, a boundary between the lower body portion 102f and the upper body portion 103f may be located in the first concave portion 402S1.

A surface profile of the first lower convex portion 401S1 may be different from a surface profile of the first upper convex portion 403S1. For example, a shape of the first lower convex portion 401S1 may be different from a shape of the first upper convex portion 403S1. A slope of a surface of the first upper convex portion 403S1 closest to the first lower convex portion 401S1 may be more gradual than a slope of a surface of the first lower convex portion 401S1 closest to the first isolation layer 201.

An area of the first lower convex portion 401S1 may be less than an area of the first upper convex portion 403S1. For example, a maximum horizontal length of the first lower convex portion 401S1 may be less than a maximum horizontal length of the first upper convex portion 403S1. A vertical length of the first lower convex portion 401S1 may be less than a vertical length of the first upper convex portion 403S1. A level of a boundary between the lower body portion 102f and the upper body portion 103f may be near an uppermost level of the first concave portion 402S1 near an inflection point.

The second side epitaxial layer 400S2 may be located on the second side surface 110S2 of the fin body 110. A lowermost level of the second side epitaxial layer 400S2 may be lower than the lowermost level of the body recessed portion 110r on the second side surface 110S2. For example, the lowermost level of the second side epitaxial layer 400S2 may be the same as the level of the upper surface of the second isolation layer 202.

A surface profile of the second side epitaxial layer 400S2 may have a curved irregular shape. For example, the surface profile of the second side epitaxial layer 400S2 may have a wave shape.

The lowermost level of the second side epitaxial layer 400S2 may be higher than the lowermost level of the first side epitaxial layer 400S1. The surface profile of the second side epitaxial layer 400S2 may be different from the surface profile of the first side epitaxial layer 400S1.

The second side epitaxial layer 400S2 may include a second lower convex portion 401S2, a second concave portion 402S2, and a second upper convex portion 403S2.

The second lower convex portion 401 S2 may be located on the second side surface 110S2 of the lower body portion 102f of the fin body 110. The second upper convex portion 403S2 may be located on the second side surface 110S2 of the upper body portion 103f of the fin body 110. The second concave portion 402S2 may be located between the second lower convex portion 401S2 and the second upper convex portion 403S2. For example, a boundary between the lower body portion 102f and the upper body portion 103f may be located in the second concave portion 402S2.

A surface profile of the second upper convex portion 403S2 may be the same as the surface profile of the first upper convex portion 403S1. The surface profile of the second upper convex portion 403S2 may be symmetrical with the surface profile of the first upper convex portion 403S1 based on the corresponding fin body 110.

A surface profile of the second lower convex portion 401S2 may be different from the surface profile of the second upper convex portion 403S2. For example, a maximum horizontal length of the second lower convex portion 401S2 may be less than a maximum horizontal length of the second upper convex portion 403S2. A vertical length of the second lower convex portion 401 S2 may be less than a vertical length of the second upper convex portion 403S2. A level of the boundary between the lower body portion 102f and the upper body portion 103f may be near an uppermost level of the second concave portion 402S2 near an inflection point between 402S2 and 403S2. The uppermost level of the second concave portion 402S2 may be the same as the uppermost level of the first concave portion 402S1.

The surface profile of the second lower convex portion 401S2 may be different from the surface profile of the first lower convex portion 401S1. For example, the vertical length of the second lower convex portion 401S2 may be less than the vertical length of the first lower convex portion 401S1.

A surface profile of the second concave portion 402S2 may be different from a surface profile of the first concave portion 402S1. For example, a vertical length of the second concave portion 402S2 may be less than a vertical length of the first concave portion 402S1. A lowermost level of the second concave portion 402S2 may be higher than a lowermost level of the first concave portion 402S1. It will be understood that "vertical length" refers to the length of the particular epitaxial layer along the side of the fin toward the top of the fin. The term "horizontal length" refers to the distance particular epitaxial layer extends away from the center of the fin.

The upper epitaxial layer 400T may be located on the corresponding fin body 110, the first side epitaxial layer 400S1, and the second side epitaxial layer 400S2. The body recessed portion (or ledge) 110r may be completely filled with the first side epitaxial layer 400S1, the second side epitaxial layer 400S2, and the upper epitaxial layer 400T.

In the semiconductor device in accordance with embodiments of the inventive concept, the epitaxial layer 400 may include the first concave portion 402S1 located on the first side surface 110S1 of the fin body 110 and the second concave portion 402S2 located on the second side surface 110S2 of the fin body 110. Accordingly, in the semiconductor device in accordance with embodiments of the inventive concept, the epitaxial layer 400 may be peanut shell shaped. For example, in the semiconductor device in accordance with embodiments of the inventive concept, the epitaxial layer 400 having a symmetrical snowman shape may be located on an upper surface of the fin body 110 located between the second trenches t2. For example, in the semiconductor device in accordance with embodiments of the inventive concept, the upper surface of the fin body 110 located between the first trench t1 and the second trench t2 may be covered with the epitaxial layer 400 having an asymmetrical hourglass shape with both sides of a neck portion of the hourglass being defined by the location of the ledge 110r on the respective side of the fin 110.

The interlayer insulating layer 600 may be located between the gate assemblies 300. The interlayer insulating layer 600 may cover the epitaxial layer 400. The interlayer insulating layer 600 may fill between the gate spacers 500.

The interlayer insulating layer 600 may include an insulating material. For example, the interlayer insulating layer 600 may include silicon oxide (SiO) or silicon nitride (SiN).

The semiconductor device in accordance with embodiments of the inventive concept may further include an epitaxial capping layer 610 and an etch stop layer 620 which are located between the epitaxial layer 400 and the interlayer insulating layer 600. The epitaxial capping layer 610 and the etch stop layer 620 may each include an insulating material. The etch stop layer 620 may include a material having an etch selectivity with respect to the interlayer insulating layer 600 and the epitaxial capping layer 610. For example, the interlayer insulating layer 600 and the epitaxial capping layer 610 may each include silicon oxide (SiO), and the etch stop layer 620 may include silicon nitride (SiN).

As a result, the semiconductor device in accordance with embodiments of the inventive concept includes the fin bodies including layers having different lattice structures and the epitaxial layer which is located on the upper surface of the fin body and has a peanut shape. Accordingly, in the semiconductor device in accordance with embodiments of the inventive concept, an electrical characteristic of the fin body may be improved.

Figure 4A:
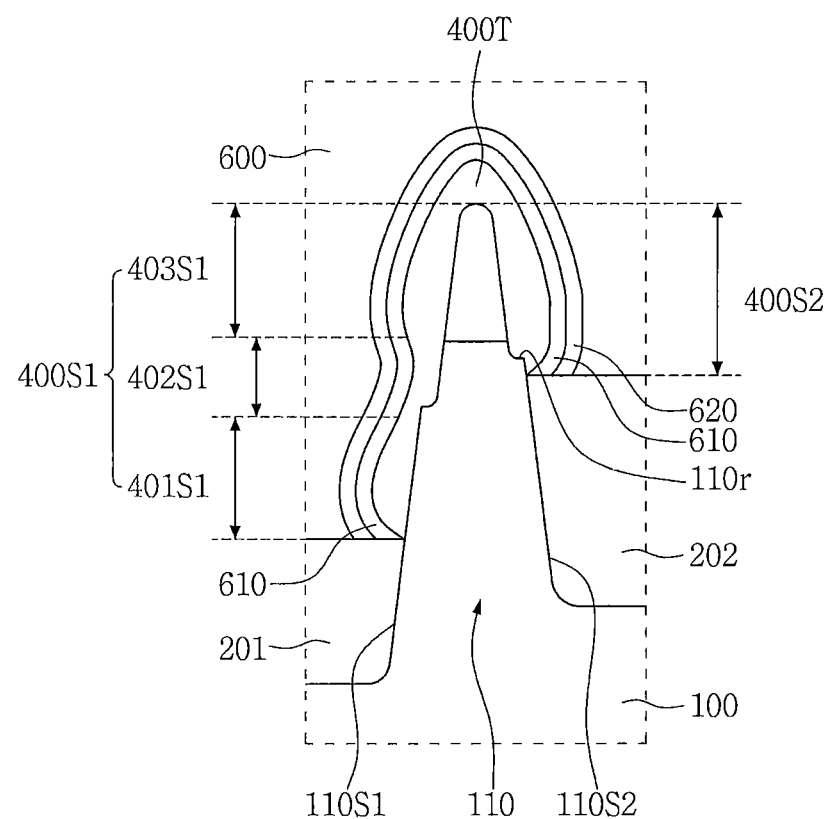
FIGS. 4A to 4D are views showing fin bodies and epitaxial layers of semiconductor devices according to other embodiments of the inventive concept.

In the semiconductor device in accordance with embodiments of the inventive concept, it was described that the epitaxial layer 400 has a peanut shell shape. However, in the semiconductor device in accordance with some embodiments of the inventive concept, the epitaxial layer 400 may have a different shape according to the level of the upper surface of the second isolation layer 202. For example, as shown in FIG. 4A, in the semiconductor device in accordance with embodiments of the inventive concept, the surface profile of the second side epitaxial layer 400S2 may have a convex shape.

Figure 4B:
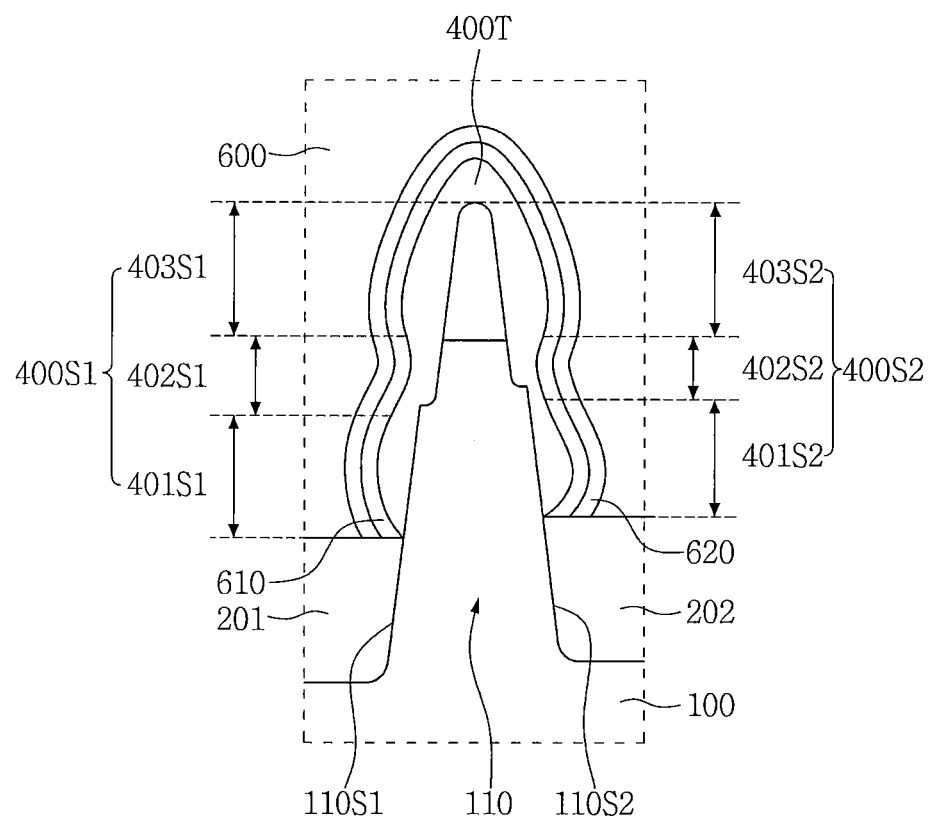
Figure 4C:
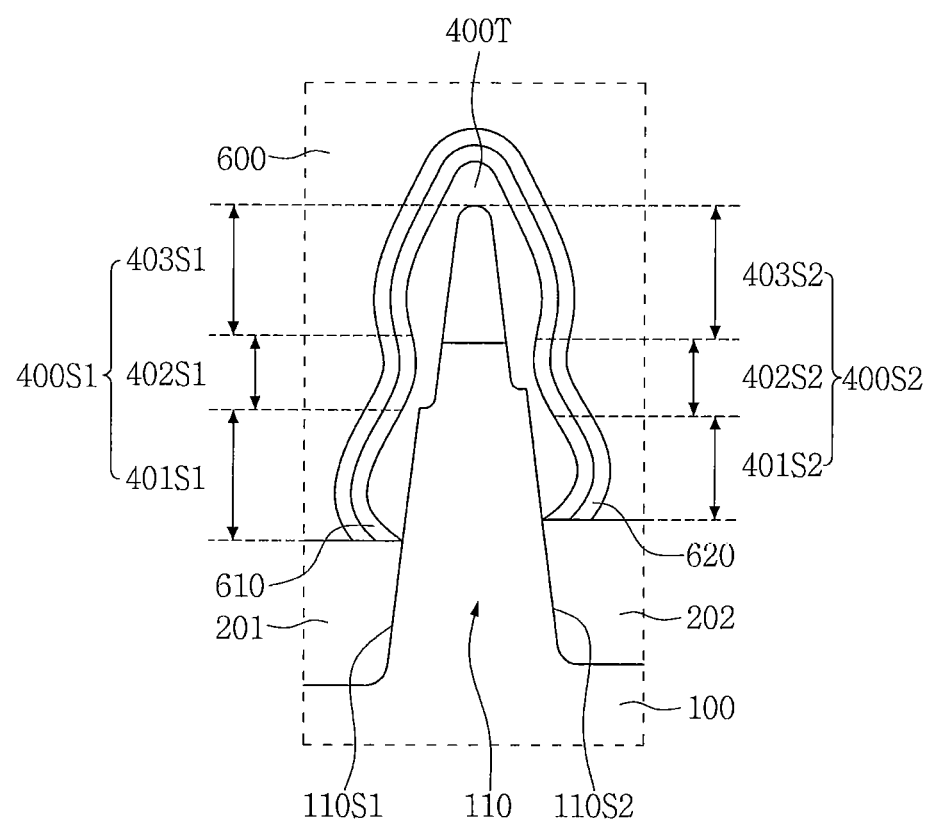

Further, in the semiconductor device in accordance with embodiments of the inventive concept, it was described that the surface profile of the first lower convex portion 401S1 of the first side epitaxial layer 400S1 is different from the surface profile of the first upper convex portion 403S1, and the lower convex portions 401S1 and 401S2 have smaller areas than the upper convex portions 403S1 and 403S2, respectively. However, in the semiconductor device in accordance with some embodiments of the inventive concept, the surface profile of the first lower convex portion 401S1 of the first side epitaxial layer 400S1 may be the same as the surface profile of the first upper convex portion 403S1 as shown in FIG. 4B, and the areas of the lower convex portions 401S1 and 401S2 may be the same as those of the upper convex portions 403S1 and 403S2 as shown in FIG. 4C.

Figure 4D:
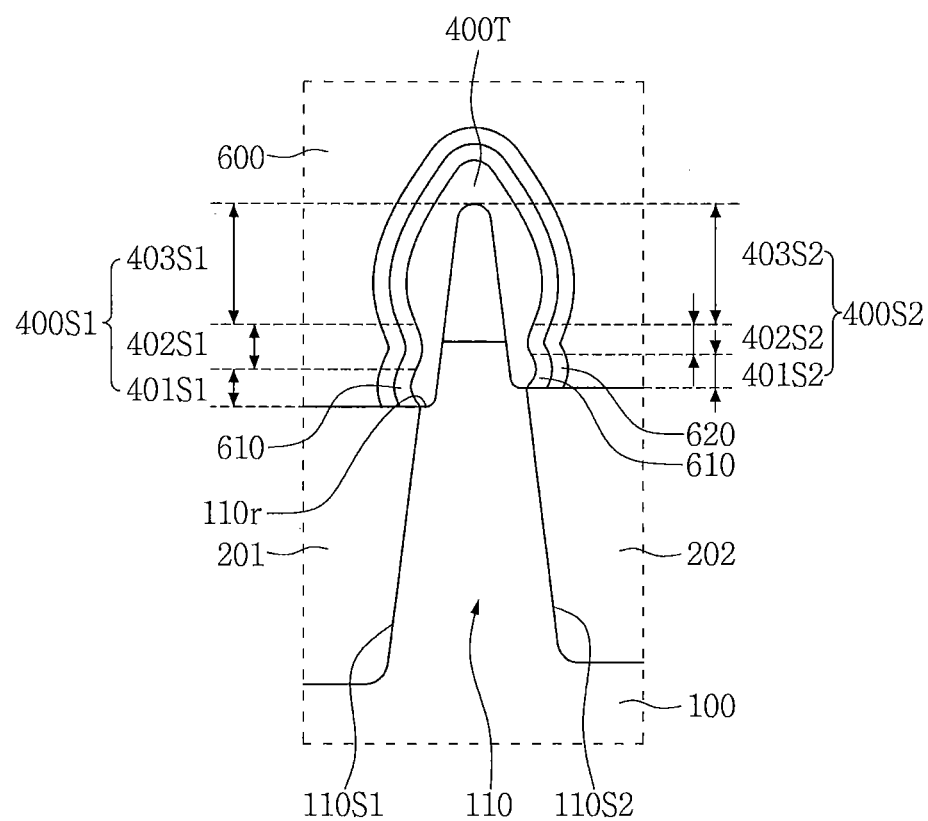

In addition, in the semiconductor device in accordance with embodiments of the inventive concept, it was described that the lowermost level of the first side epitaxial layer 400S1 and the level of the upper surface of the first isolation layer 201 are lower than the lowermost level of the body recessed portion 110r on the first side surface 110S1 of the fin body 110, and the lowermost level of the second side epitaxial layer 400S2 and the level of the upper surface of the second isolation layer 202 are lower than the lowermost level of the body recessed portion 110r on the second side surface 110S2 of the fin body 110. However, in the semiconductor device in accordance with some embodiments of the inventive concept, the lowermost level of the body recessed portion 110r on the first side surface 110S1 of the fin body 110 may be the same as the lowermost level of the first side epitaxial layer 400S1 and the level of the upper surface of the first isolation layer 201 as shown in FIG. 4D, and the lowermost level of the body recessed portion 110r on the second side surface 110S2 of the fin body 110 may be the same as the lowermost level of the second side epitaxial layer 400S2 and the level of the upper surface of the second isolation layer 202.

Figure 5:
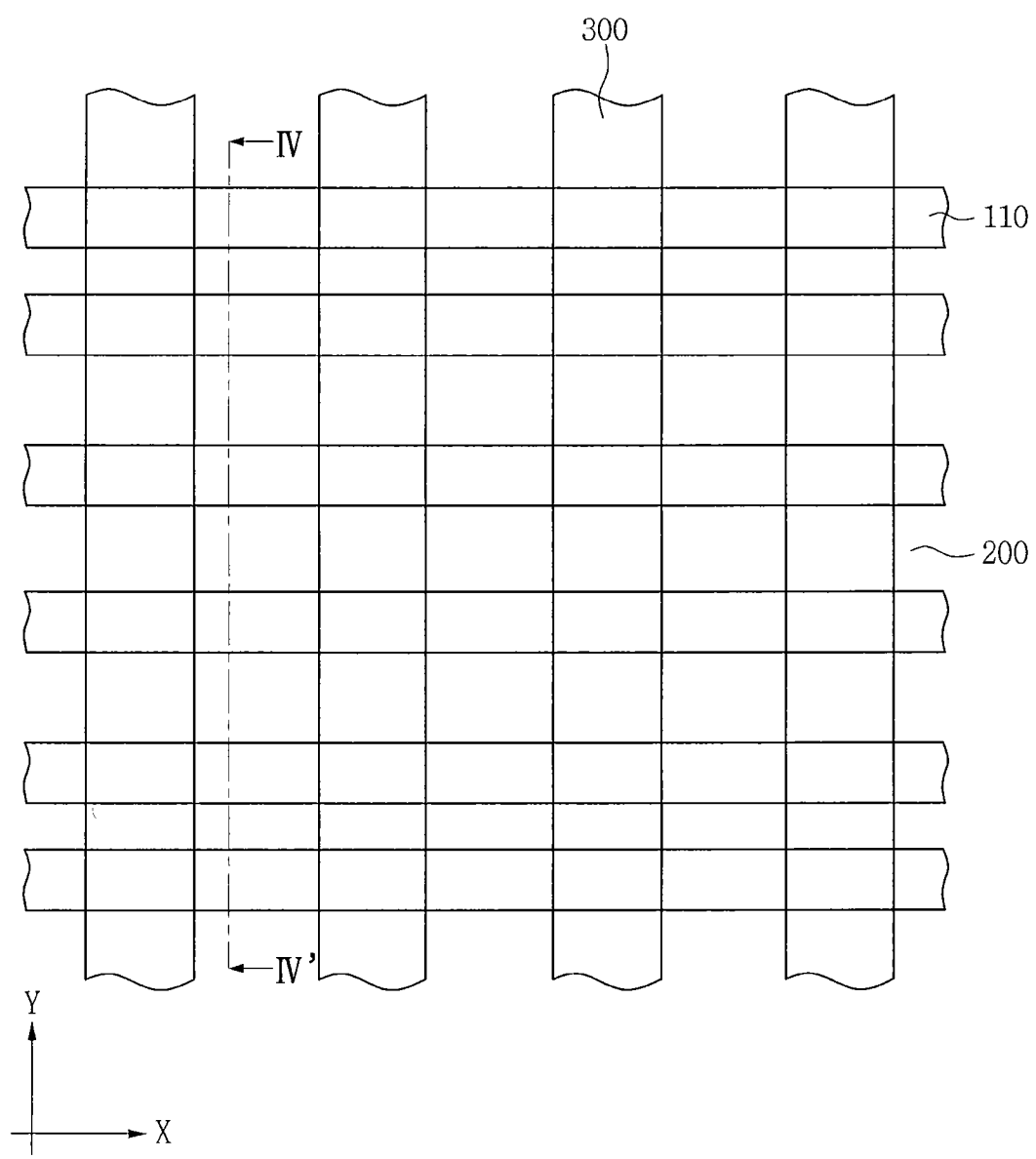
FIG. 5 is a plan view of a semiconductor device in accordance with some embodiments of the inventive concept.
Figure 6:
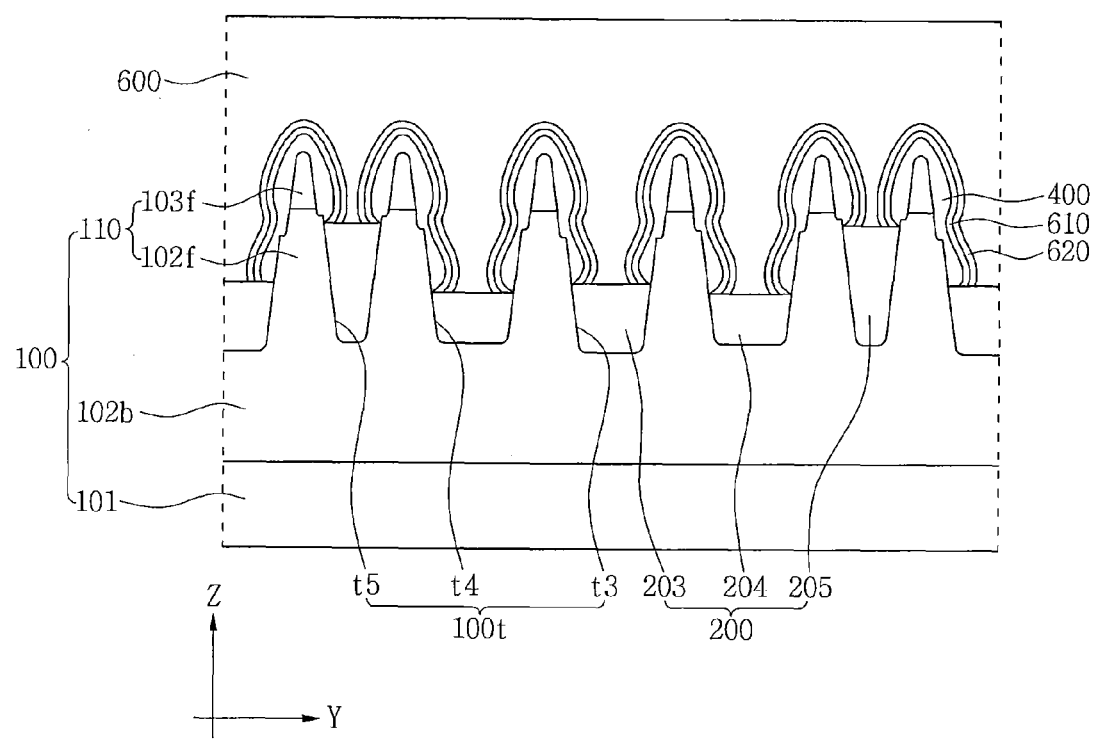
FIG. 6 is a cross-sectional view taken along line IV-IV' of FIG. 5.

FIG. 5 is a plan view of a semiconductor device in accordance with some embodiments of the inventive concept. FIG. 6 is a cross-sectional view taken along line IV-IV' of FIG. 5.

Referring to FIGS. 5 and 6, the semiconductor device in accordance with embodiments of the inventive concept may include a substrate 100, an isolation layer 200, gate assemblies 300, epitaxial layers 400, and an interlayer insulating layer 600.

The substrate 100 may include a base substrate 101, a lower SRB layer 102b, and fin bodies 110. The substrate 100 may further include trenches 100t located between the fin bodies 110.

The trenches 100t may include a first trench t3, a second trench t4, and a third trench t5. A horizontal width of the second trench t4 may be less than a horizontal width of the first trench t3. A horizontal width of the third trench t5 may be less than the horizontal width of the second trench t4.

The isolation layer 200 may be a first isolation layer 203, a second isolation layer 204, and a third isolation layer 205. A horizontal width of the first isolation layer 203 may be less than a horizontal width of the second isolation layer 204. A level of an upper surface of the first isolation layer 203 may be higher than a level of an upper surface of the second isolation layer 204. A horizontal width of the third isolation layer 205 may be less than the horizontal width of the first isolation layer 203. A level of an upper surface of the third isolation layer 205 may be higher than the level of the upper surface of the first isolation layer 203.

The epitaxial layers 400 may have various shapes relative to height differences among the isolation layers 203, 204, and 205 located on lower portions of the fin bodies 110. For example, a surface profile of the epitaxial layer 400 which covers an upper surface of the fin body 110 located between the first trench t3 and the second trench t4 may have a peanut shell shape. For example, in the epitaxial layer 400 which covers an upper surface of the fin body 110 located between the second trench t4 and the third trench t5, a profile of a side surface facing the second trench t4 may have a wave shape and a profile of a side surface facing the third trench t5 may have a convex shape.

FIGS. 7 to 17, 18A to 23A, and 18B to 23B are views sequentially showing methods of forming semiconductor devices in accordance with embodiments of the inventive concept. Here, FIGS. 18A and 18B are cross-sectional views taken along lines V-V' and VI-VI' of FIG. 17.

Figure 7:
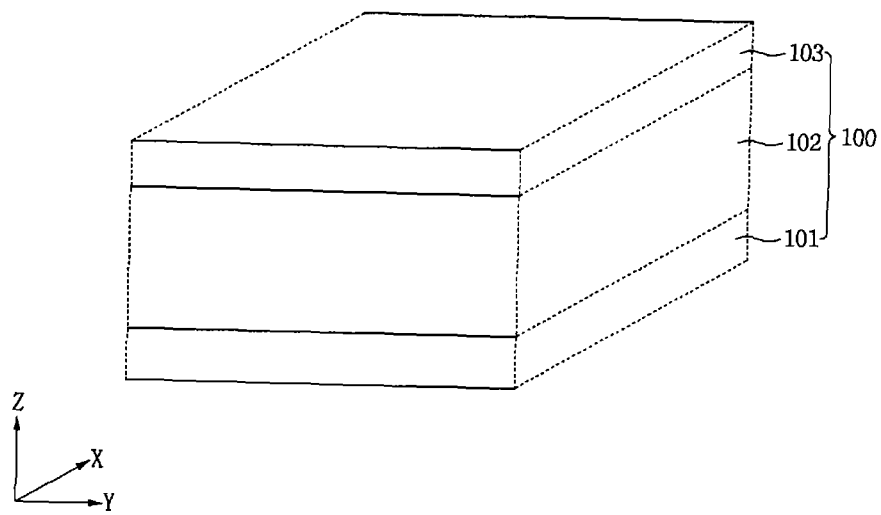

Methods of forming semiconductor devices in accordance with embodiments of the inventive concept are described with reference to FIGS. 2A to 2C, 3, 7 to 17, 18A to 23A, and 18B to 23B. Referring to FIG. 7, a substrate 100 may be prepared by forming an SRB layer 102 on a base substrate 101 and forming a stress strain layer 103 on the SRB layer 102.

The process of forming the SRB layer 102 may include a first selective epitaxial growth (SEG) process. The SRB layer 102 may be formed of a material having a lattice structure that is different than that of the base substrate 101. For example, the process of forming the SRB layer 102 may include a process of growing silicon germanium (SiGe) on the base (Si) substrate 101.

The process of forming the stress strain layer 103 may include a second SEG process. The stress strain layer 103 may be formed of a material having a lattice structure that is different from that of the SRB layer 102. For example, the process of forming the stress strain layer 103 may include a process of growing silicon on the SRB layer (SiGe) 102.

Figure 8:
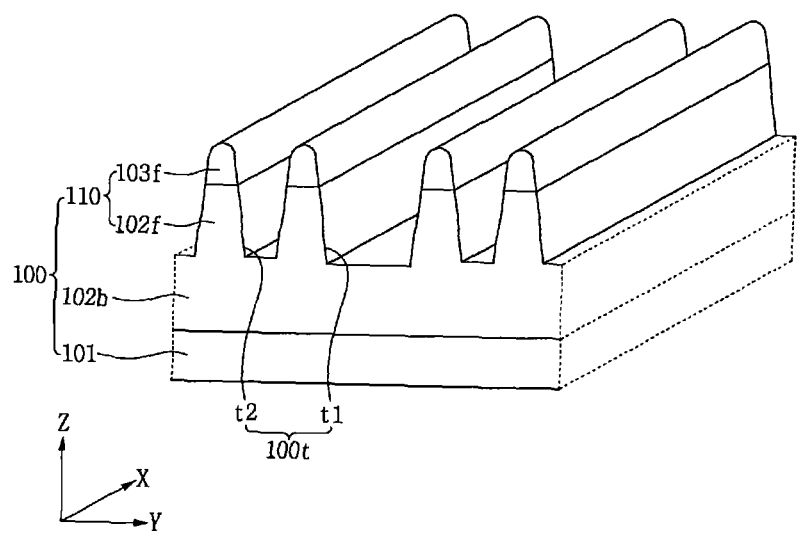

Referring to FIG. 8, fin bodies 110 can be formed on the substrate 100.

The process of forming the fin bodies 110 may include a process of forming trenches 100t in the substrate 100. A level of a bottom of the trench 100t may be lower than a level of a lower surface of the stress strain layer 103 so that the fins protrude between the trenches. The process of forming the trenches 100t may include a process of patterning the stress strain layer 103 and a process of recessing the SRB layer 102 so that the fin bodies 110 have the specified spacing therebetween.

The process of patterning the stress strain layer 103 may include a process of forming upper body portions 103f. The process of recessing the SRB layer 102 may include a process of forming lower body portions 102f and a lower SRB layer 102b. Each of the fin bodies 110 may include a respective lower body portion 102f and a respective upper body portion 103f having a different lattice structure from the lower body portion 102f by the process of forming the trenches 100t.

The process of forming the trenches 100t may include a process of forming first trenches t1 and a process of forming second trenches t2. A horizontal width of the second trench t2 may be smaller than a horizontal width of the first trench t1. A level of a bottom of the second trench t2 may be higher than a level of a bottom of the first trench t1. The process of forming the first trench t1 may be separately performed from the process of forming the second trench t2.

Figure 9:
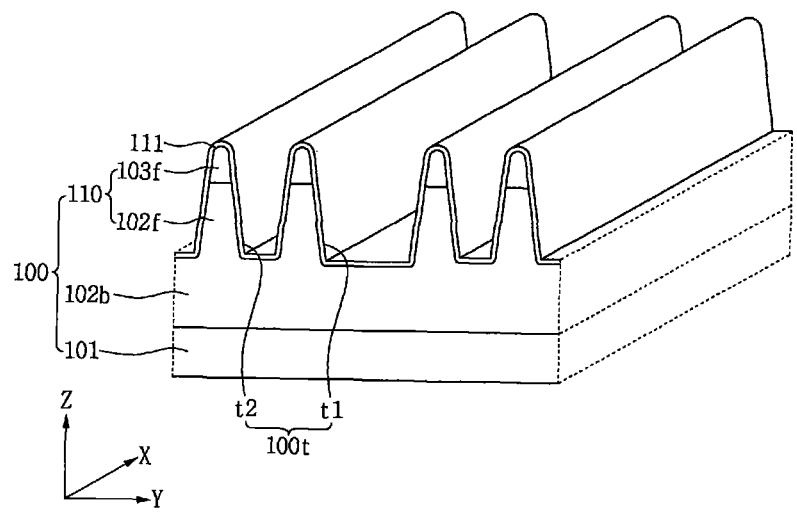
Figure 10:
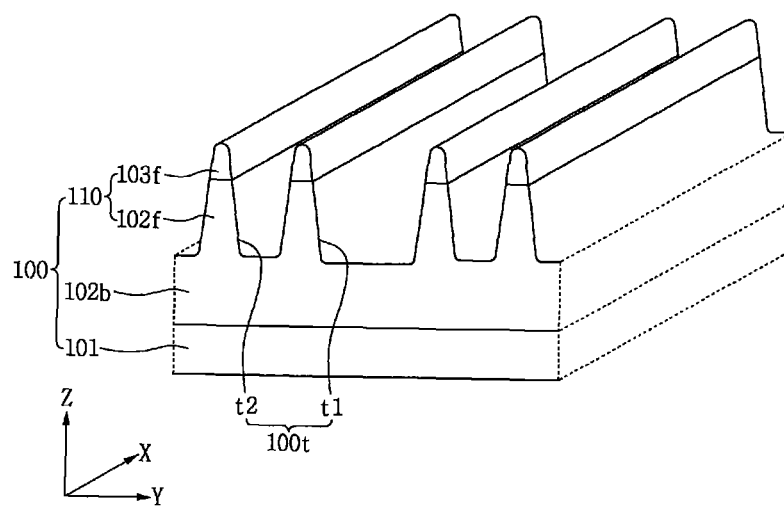

Referring to FIGS. 9 and 10, a process of trimming the fin bodies 110 may include reducing horizontal widths of the fin bodies 110. For example, the process of trimming the fin bodies 110 may include a process of forming a first sacrificial thermal oxide layer 111 on surfaces of the fin bodies 110 and removing the first sacrificial thermal oxide layer 111. The process of forming the first sacrificial thermal oxide layer 111 may include a thermal oxidation process.

It was described that the method of forming the semiconductor device in accordance with embodiments of the inventive concept reduces the horizontal widths of the fin bodies 110 using a thermal oxidation process. However, methods of forming semiconductor devices in accordance with embodiments of the inventive concept may reduce the horizontal widths of the fin bodies 110 by various methods.

Figure 11:
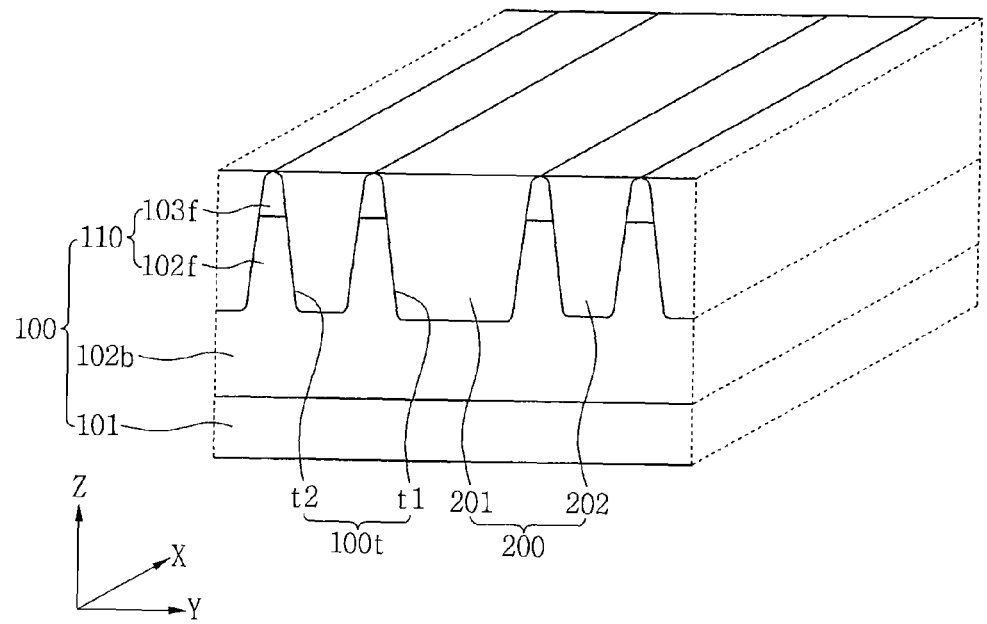

Referring to FIG. 11, an isolation layer 200 can be formed between the fin bodies 110 by depositing an isolation insulating material, such as silicon oxide (SiO), on the substrate 100 in which the fin bodies 110 are formed, and planarizing the isolation insulating material. The planarization process may include a chemical mechanical polishing (CMP) process.

The process of forming the isolation layer 200 may include a process of forming a first isolation layer 201 and a process of forming a second isolation layer 202. The first isolation layer 201 may be formed in the first trench t1. The second isolation layer 202 may be formed in the second trench t2. The second isolation layer 202 may be formed simultaneously with forming the first isolation layer 201.

Figure 12:
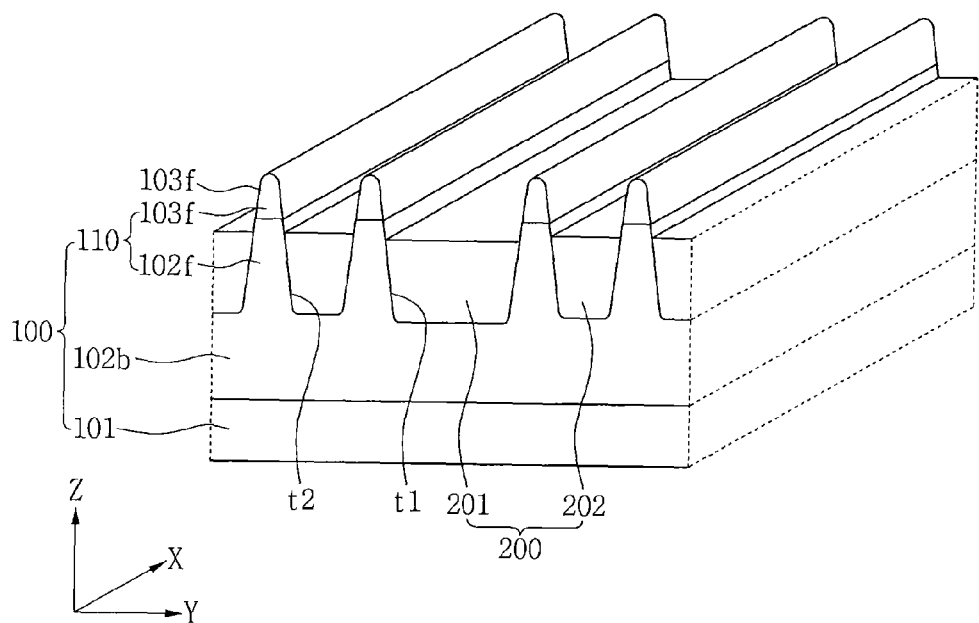

Referring to FIG. 12, an upper surface of the isolation layer 200 can be lowered (recessed).

A horizontal width of the second isolation layer 202 may be less than a horizontal width of the first isolation layer 201. A level of an upper surface of the second isolation layer 202 may be different from a level of an upper surface of the first isolation layer 201 by the process of recessing the upper surface of the isolation layer 200. For example, the upper surface of the first isolation layer 201 may be formed lower than the upper surface of the second isolation layer 202 by the process of lowering the upper surface of the isolation layer 200. In other words, the process of recessing the isolation layer 200 may result in the first isolation layer 201 being recessed more than the second isolation layer 202, due to the different widths of the trenches.

Figure 13:
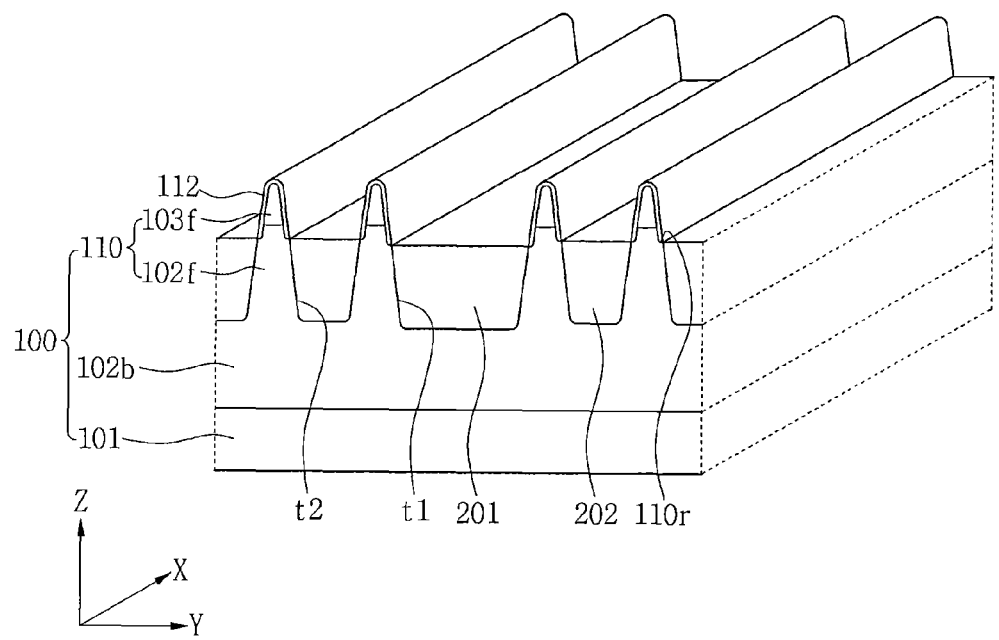
Figure 14:
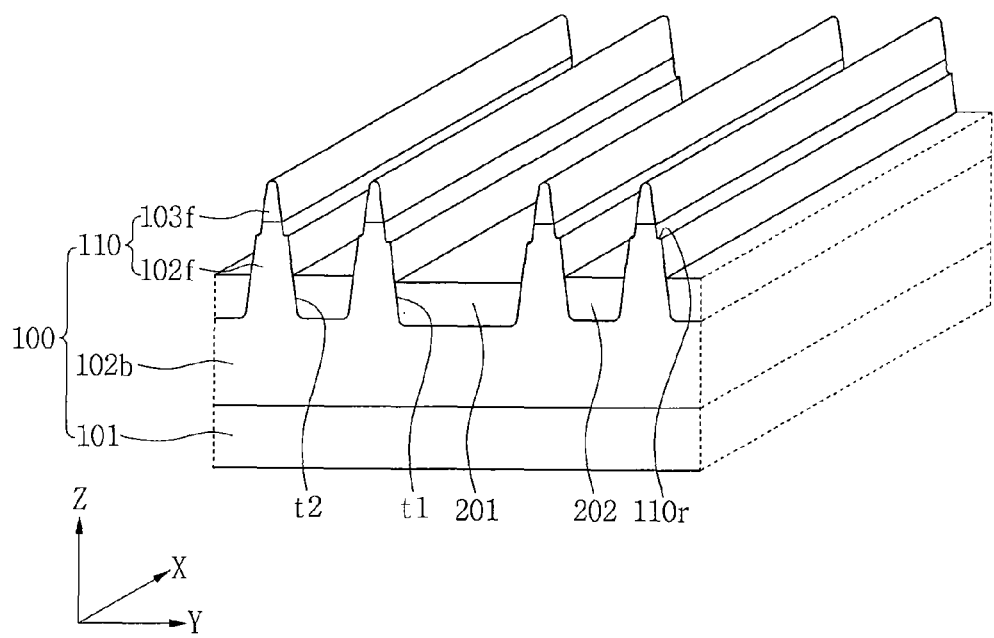

Referring to FIGS. 13 and 14, a body recessed portion (or shoulder) 110r can be formed on an upper surface of each of the fin bodies 110 exposed by the isolation layer 200.

The process of forming the body recessed portion (or shoulder) 110r may include a process of forming a second sacrificial thermal oxide layer 112 on the upper surface of each of the fin bodies 110 exposed by the first isolation layer 201 and the second isolation layer 202, and removing the second sacrificial thermal oxide layer 112. The process of forming the second sacrificial thermal oxide layer 112 may include a thermal oxidation process.

Since the level of the upper surface of the first isolation layer 201 is different from the level of the upper surface of the second isolation layer 202, a lowermost level of the body recessed portion (shoulder) 110r may be different on the first side surface 110S1 and second side surface 110S2 of the fin body 110. For example, the lowermost level of the body recessed portion (shoulder) 110r on the first side surface 110S1 of the fin body 110 may be lower than the lowermost level of the body recessed portion (shoulder) 110r on the second side surface 110S2 of the fin body 110.

The upper surface of the first isolation layer 201 and the upper surface of the second isolation layer 202 may be further recessed by the process of removing the second sacrificial thermal oxide layer 112. For example, the lowermost level of the body recessed portion (shoulder) 110r on the first side surface 110S1 of the fin body 110 may be higher than the level of the upper surface of the first isolation layer 201. The lowermost level of the body recessed portion 110r on the second side surface 110S2 of the fin body 110 may be higher than the level of the upper surface of the second isolation layer 202.

It was described that the method of forming the semiconductor device in accordance with the embodiment of the inventive concept forms the body recessed portion (shoulder) 110r on the upper surface of the fin body 110 using a thermal oxidation process. However, in the method of forming the semiconductor device in accordance with embodiments of the inventive concept, the body recessed portion 110r may be formed by various methods. Further, in the method of forming the semiconductor device in accordance with embodiments of the inventive concept, the upper surface of the first isolation layer 201 and the upper surface of the second isolation layer 202 may not be lowered according to the method of forming the body recessed portion 110r. For example, in the method of forming the semiconductor device in accordance with embodiments of the inventive concept, the lowermost level of the body recessed portion (shoulder) 110r on the first side surface 110S1 of the fin body 110 may be the same as the level of the upper surface of the first isolation layer 201, and the lowermost level of the body recessed portion (shoulder) 110r on the second side surface 110S2 of the fin body 110 may be the same as the level of the upper surface of the second isolation layer 202.

Figure 15:
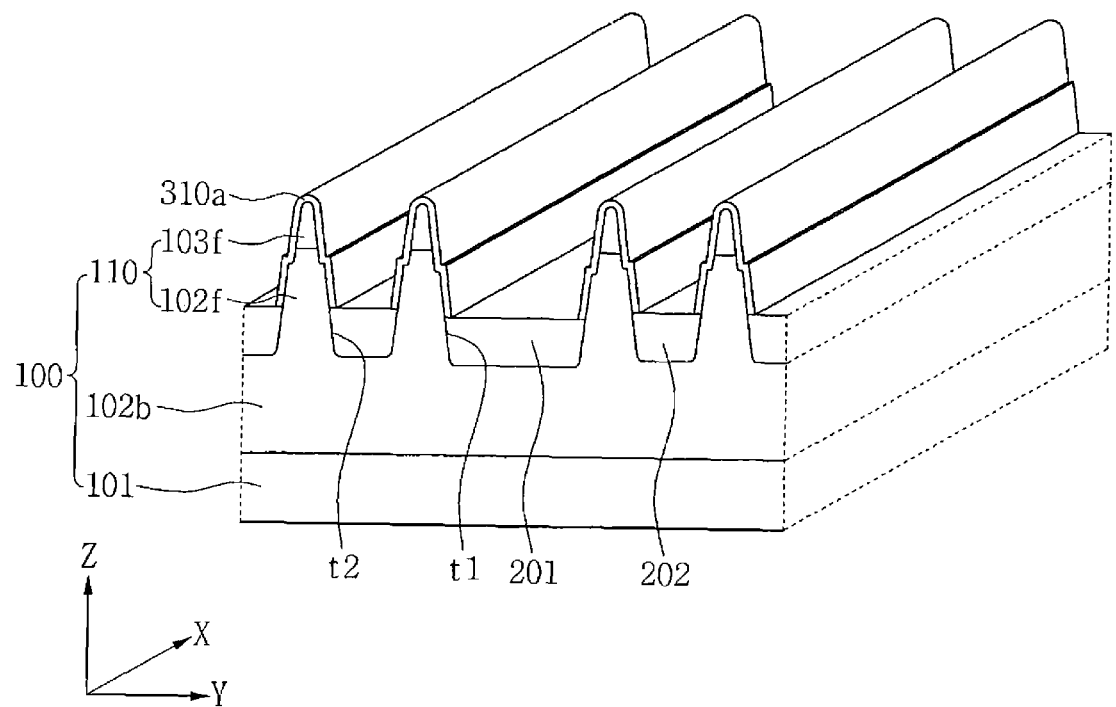

Referring to FIG. 15, a surface insulating layer 310a can be formed on the surfaces of the fin bodies 110 exposed by the first isolation layer 201 and the second isolation layer 202.

The process of forming the surface insulating layer 310a may include a process of oxidizing the exposed surfaces of the fin bodies 110. For example, the process of forming the surface insulating layer 310a may include a thermal oxidation process.

Figure 16:
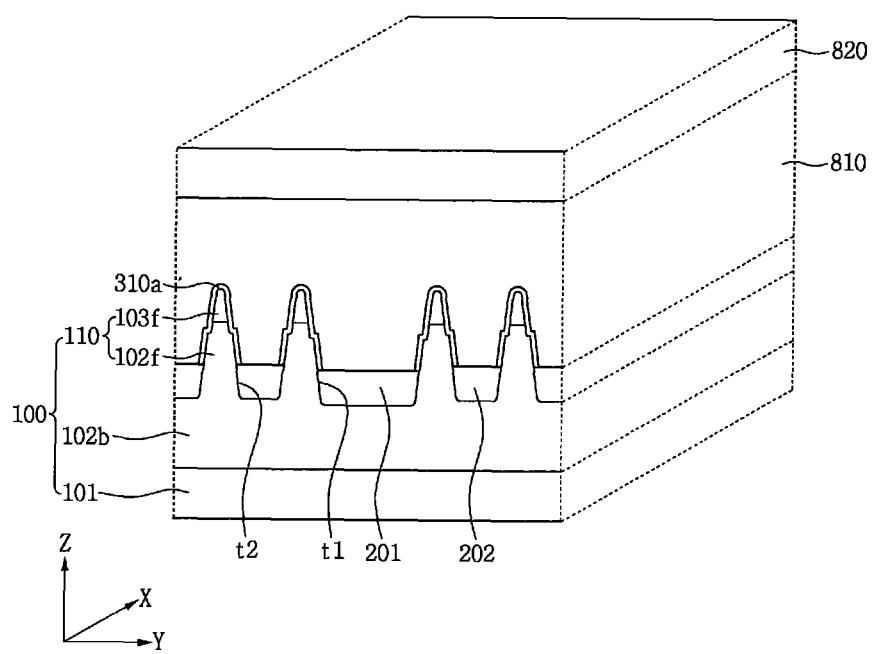

Referring to FIG. 16, a sacrificial gate electrode material layer 810 and a sacrificial gate capping layer 820 can be formed on the substrate 100 on which the surface insulating layer 310a is formed.

The process of forming the sacrificial gate electrode material layer 810 and the sacrificial gate capping layer 820 may include a process of forming the sacrificial gate electrode material layer 810, a process of planarizing the sacrificial gate electrode material layer 810, and a process of forming the sacrificial gate capping layer 820 on the planarized sacrificial gate electrode material layer 810. The planarization process may include a CMP process.

Figure 17:
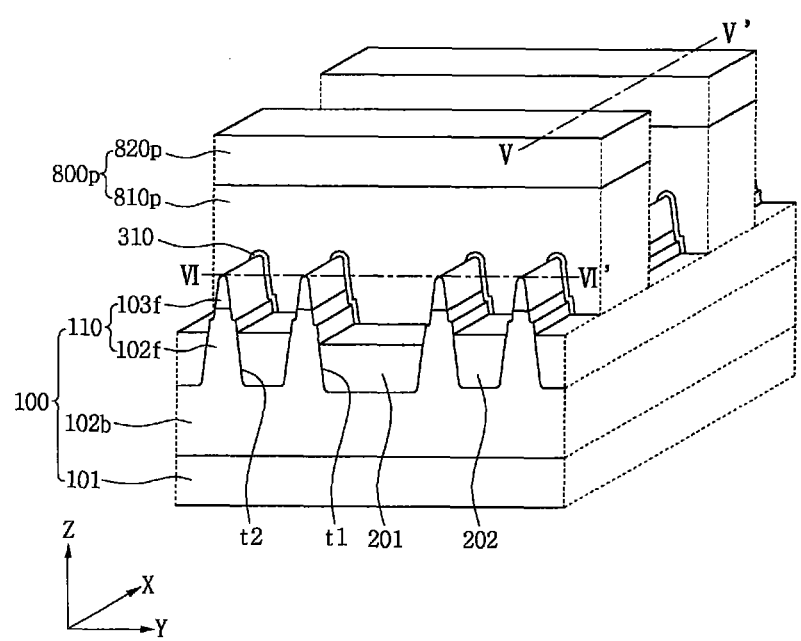
Figure 18A:
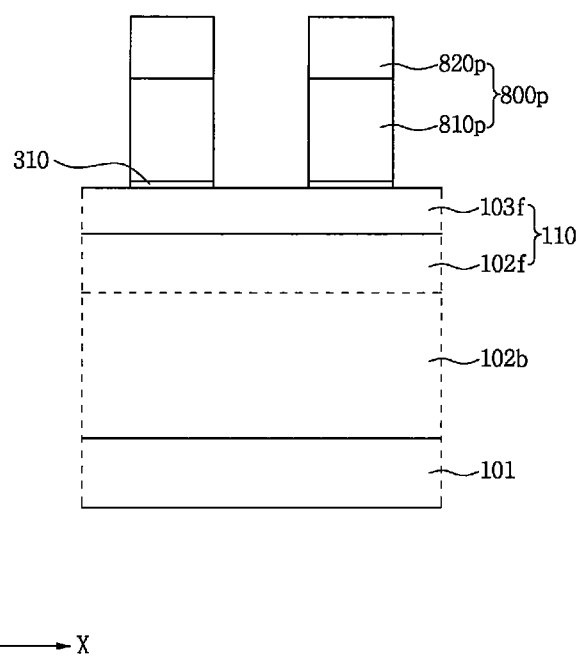
Figure 18B:
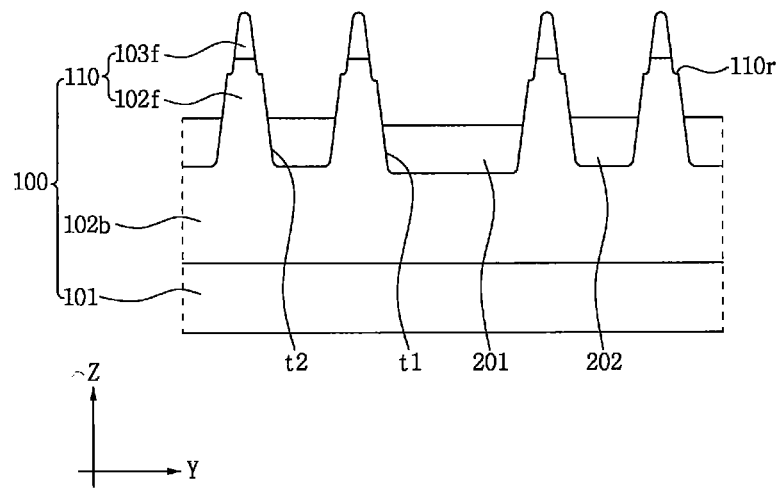

Referring to FIGS. 17, 18A, and 18B, surface insulating patterns 310 and sacrificial gate patterns 800p can be formed.

The process of forming the surface insulating patterns 310 and the sacrificial gate patterns 800p may include a process of forming the sacrificial gate patterns 800p and a process of forming the surface insulating patterns 310.

The process of forming the sacrificial gate patterns 800p may include a process of patterning the sacrificial gate capping layer 820 and a process of patterning the sacrificial gate electrode material layer 810. The process of patterning the sacrificial gate capping layer 820 may include a process of forming sacrificial gate capping patterns 820p. The process of patterning the sacrificial gate electrode material layer 810 may include a process of forming sacrificial gate electrode patterns 810p. Each of the sacrificial gate patterns 800p may include the sacrificial gate electrode pattern 810p and the sacrificial gate capping pattern 820p.

The process of forming the surface insulating patterns 310 may include a process of patterning the surface insulating layer 310a.

Figure 19A:
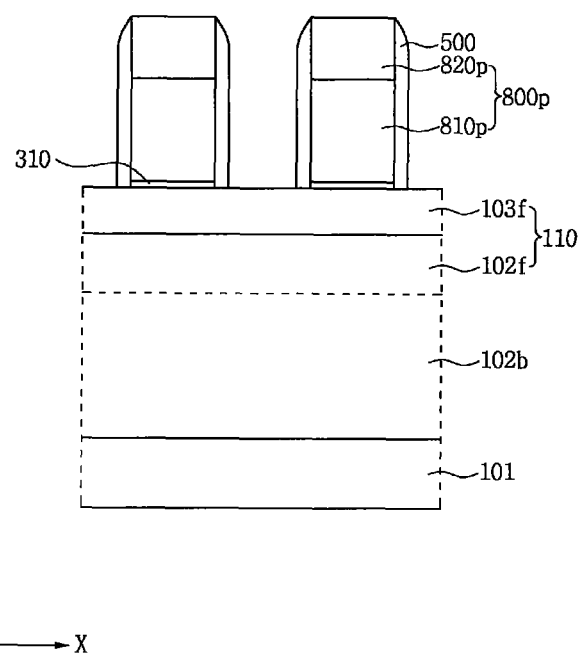
Figure 19B:
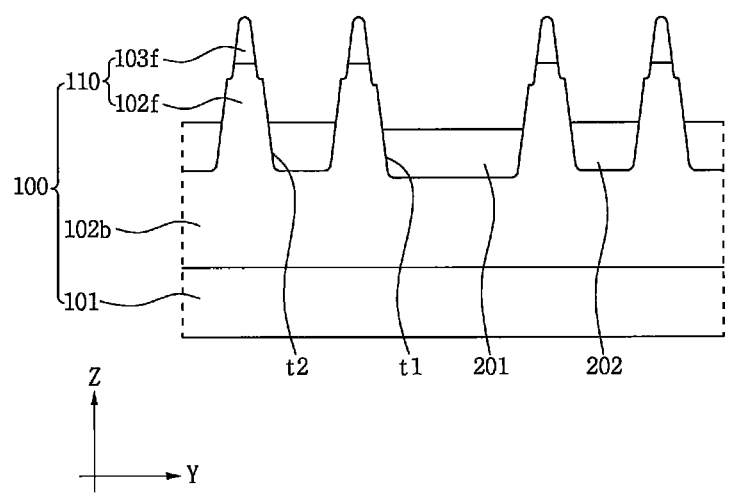

Referring to FIGS. 19A and 19B, gate spacers 500 can be formed on side surfaces of the sacrificial gate patterns 800p.

The process of forming the gate spacers 500 may include a process of forming a spacer insulating layer on the substrate 100 on which the sacrificial gate patterns 800p are formed, and a process of etching the spacer insulating layer.

The spacer insulating layer may be formed of a material having an etch selectivity with respect to the sacrificial gate electrode patterns 810p. For example, the sacrificial gate electrode patterns 810p may be formed of polycrystalline silicon and the spacer insulating layer may be formed of silicon nitride (SiN).

Figure 20A:
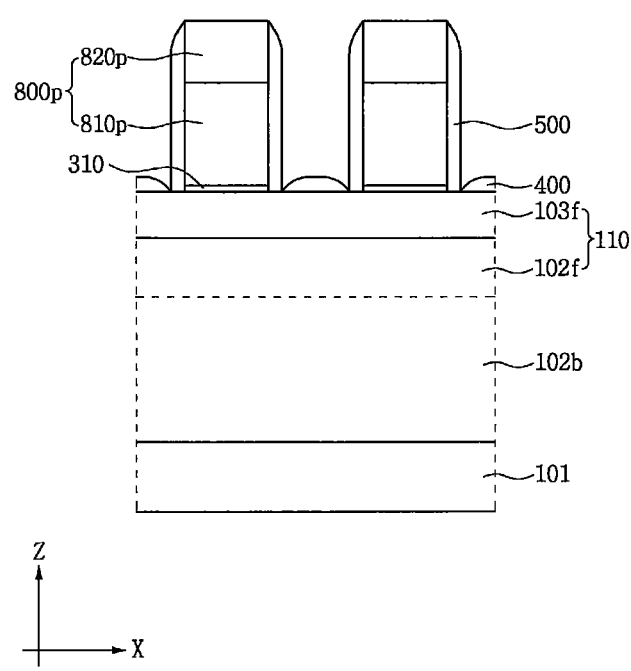
Figure 20B:
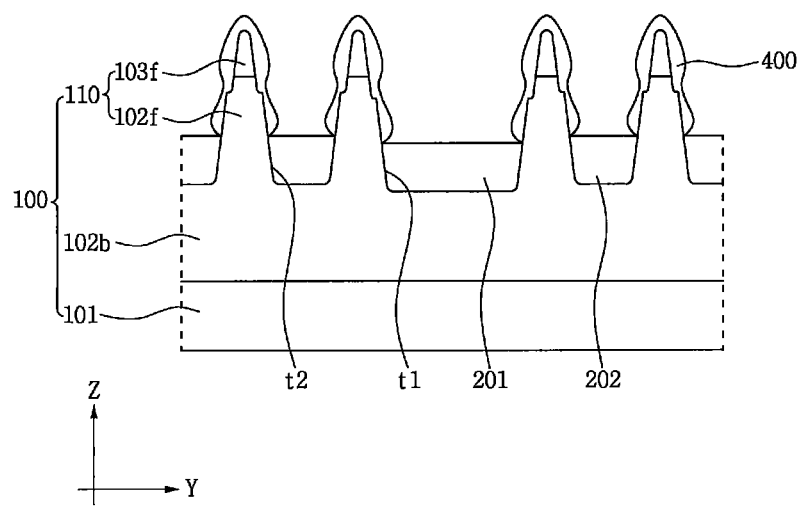

Referring to FIGS. 20A and 20B, epitaxial layers 400 can be formed on the upper surfaces of the fin bodies 110 exposed by the first isolation layer 201 and the second isolation layer 202.

The process of forming the epitaxial layers 400 may include a SEG process. The epitaxial layers 400 may cover the exposed upper surfaces of the fin bodies 110 that correspond to source/drain regions. A lowermost level of the epitaxial layer 400 may be the same as the level of the upper surface of the first isolation layer 201 or the level of the upper surface of the second isolation layer 202.

The rate of formation of the epitaxial layer 400 by the SEG process at a boundary between the lower body portion 102f and the upper body portion 103f may be different from the rate of formation of the epitaxial layer 400 by the SEG process on a surface of the lower body portion 102f and the rate of formation of the epitaxial layer 400 by the SEG process on a surface of the upper body portion 103f. For example, a growth rate of the epitaxial layer 400 at the boundary between the lower body portion 102f and the upper body portion 103f may be slower than a growth rate of the epitaxial layer 400 on the surface of the lower body portion 102f and a growth rate of the epitaxial layer 400 on the surface of the upper body portion 103f. Therefore, in the method of forming the semiconductor device in accordance with the embodiment of the inventive concept, each of the epitaxial layers 400 may include concave portions located on side surfaces of the corresponding fin body 110 near a boundary between the upper and lower body portions 102f and 103f. For example, in the method of forming the semiconductor device in accordance with embodiments of the inventive concept, the epitaxial layer 400 may be formed in a peanut shell shape, a snowman shape, or an hourglass shape where a central portion of the epitaxial layer is narrower than the upper and lower body portions 102f and 103f.

In the method of forming the semiconductor device in accordance with embodiments of the inventive concept, the rate of formation of the epitaxial layer 400 on the surface of the lower body portion 102f by the SEG process may be different from the rate of formation of the epitaxial layer 400 by the SEG process on the surface of the upper body portion 103f. For example, in the method of forming the semiconductor device in accordance with embodiments of the inventive concept, the growth rate of the epitaxial layers 400 on the surface of the lower body portion 102f may be slower than the growth rate of the epitaxial layers 400 on the surface of the upper body portion 103f. In the method of forming the semiconductor device in accordance with embodiments of the inventive concept, a lower convex portion of the epitaxial layer 400 may be formed to have a smaller area than an upper convex portion of the corresponding epitaxial layer 400.

Figure 21A:
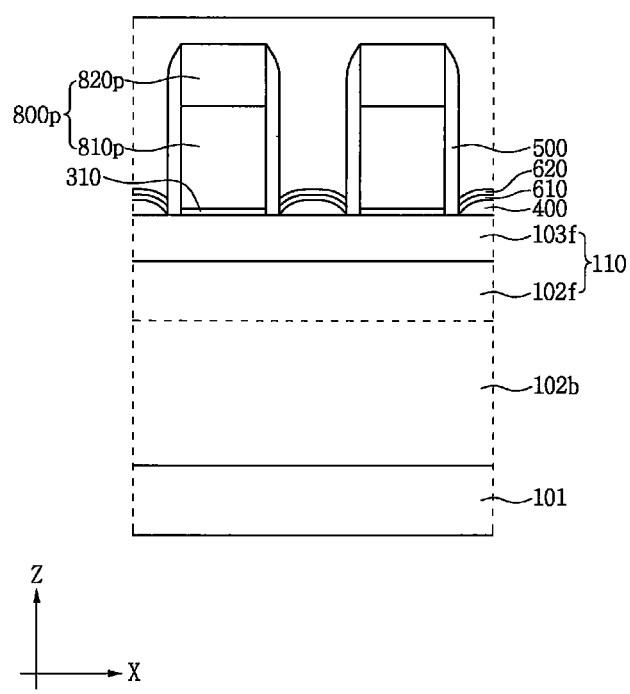
Figure 21B:
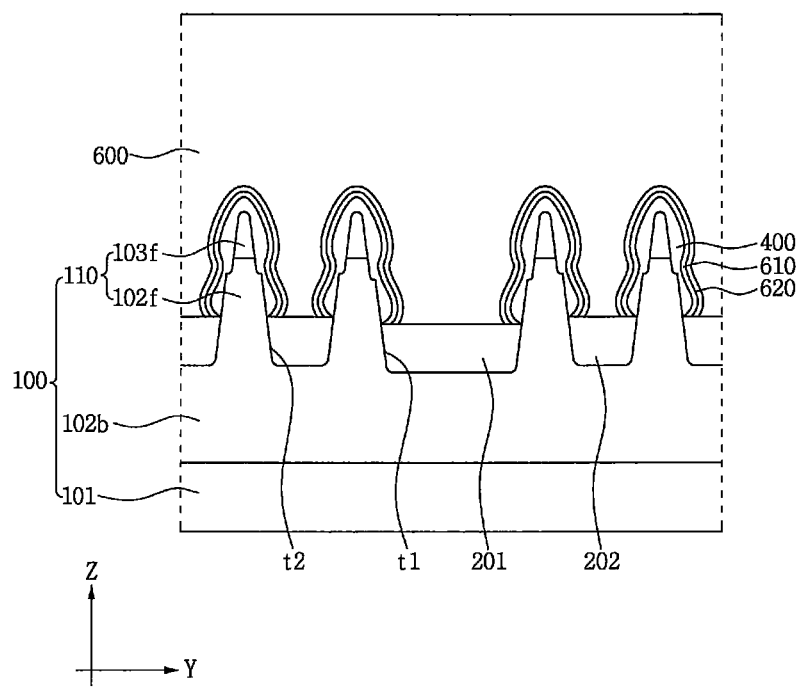

Referring to FIGS. 21A and 21B, an interlayer insulating layer 600 can be formed on the substrate 100 on which the epitaxial layers 400 are formed.

The method of forming the semiconductor device in accordance with embodiments of the inventive concept may include a process of forming an epitaxial capping layer 610 and etch stop layer 620 on the epitaxial layer 400 before the interlayer insulating layer 600 is formed. The etch stop layer 620 may be formed of a material having an etch selectivity with respect to the interlayer insulating layer 600 and the epitaxial capping layer 610. For example, in the method of forming the semiconductor device in accordance with embodiments of the inventive concept, the interlayer insulating layer 600 and the epitaxial capping layer 610 may be formed of silicon oxide (SiO), and the etch stop layer 620 may be formed of silicon nitride (SiN).

Figure 22A:
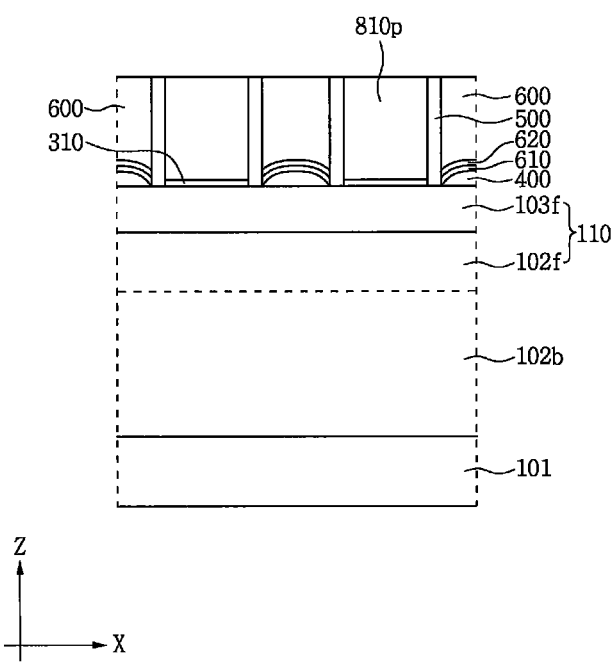
Figure 22B:
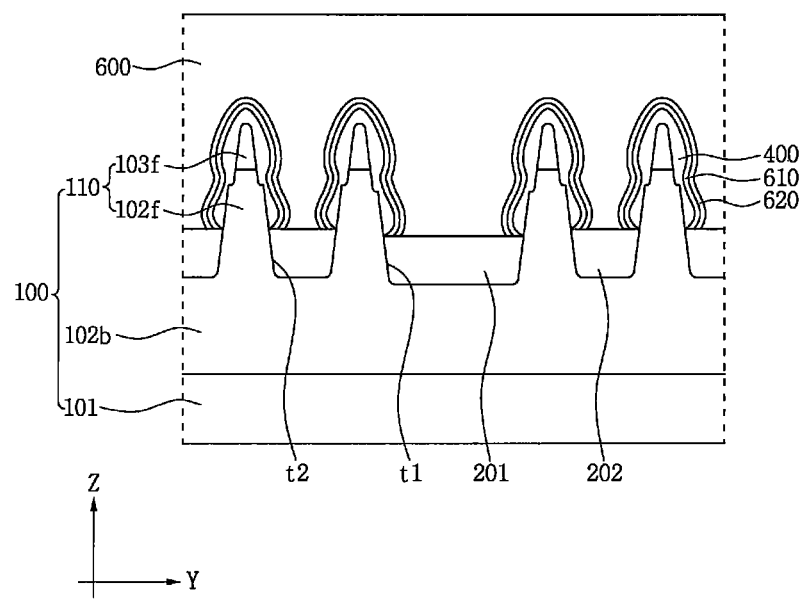

Referring to FIGS. 22A and 22B, upper surfaces of the sacrificial gate electrode patterns 810p can be exposed.

The process of exposing the upper surface of the sacrificial gate electrode patterns 810p may include a process of removing the sacrificial gate capping patterns 820p. The process of removing the sacrificial gate capping patterns 820p may include a process of planarizing the sacrificial gate patterns 800p and the interlayer insulating layer 600.

Figure 23A:
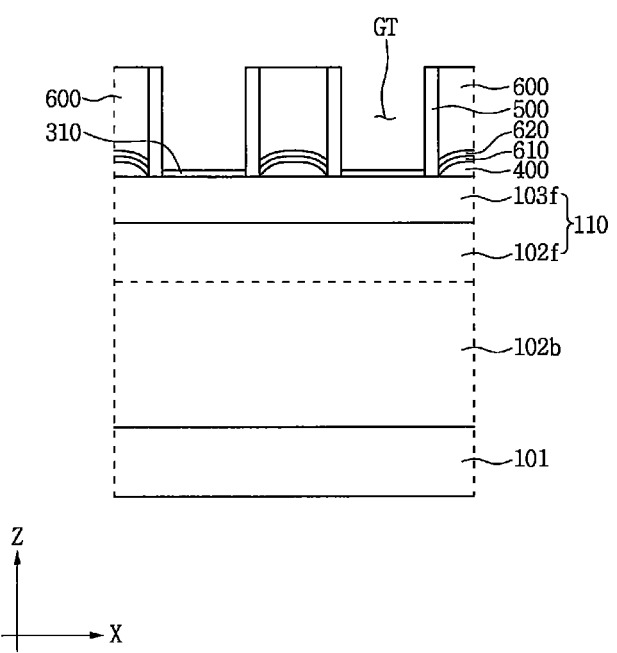
Figure 23B:
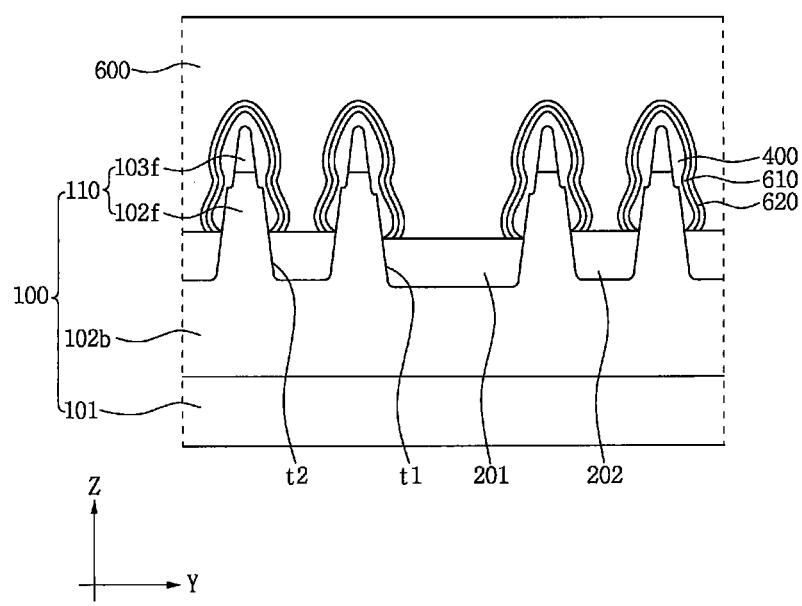

Referring to FIGS. 23A and 23B, the method of forming the semiconductor device in accordance with embodiments of the inventive concept may include a process of forming gate electrode spaces GT which expose the surface insulating patterns 310.

The process of forming the gate electrode spaces GT may include a process of removing the sacrificial gate electrode patterns 810p.

Referring to FIGS. 2A to 2C, and 3, the method of forming the semiconductor device in accordance with embodiments of the inventive concept may include a process of forming gate assemblies 300 in the gate electrode spaces GT.

The process of forming the gate assemblies 300 may include a process of forming a gate insulating pattern 320 on a surface insulating pattern 310, a process of forming a barrier pattern 330 on the gate insulating pattern 320, a process of forming a lower gate electrode 340 on the barrier pattern 330, and a process of forming an upper gate electrode 350 on the lower gate electrode 340.

Figure 24:
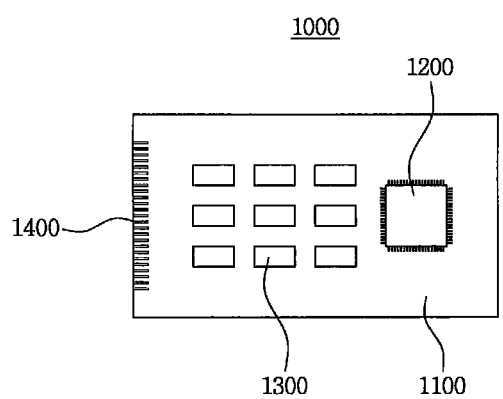
FIG. 24 illustrates a semiconductor module including the semiconductor device according to embodiments of the inventive concept.

FIG. 24 illustrates a semiconductor module including the semiconductor device according to embodiments of the inventive concept.

Referring to FIG. 24, the semiconductor module 1000 may include a module substrate 1100, a microprocessor 1200, memories 1300, and input/output terminals 1400. The microprocessor 1200, the memories 1300, and the input/output terminals 1400 may be mounted on the module substrate 1100. The semiconductor module 1000 may include a memory card or a card package.

The microprocessor 1200 and the memories 1300 may include semiconductor devices according to various embodiments of the inventive concept. Therefore, in the semiconductor module 1000 according to some embodiments of the inventive concept, electrical characteristics of the microprocessor 1200 and the memories 1300 may be improved.

Figure 25:
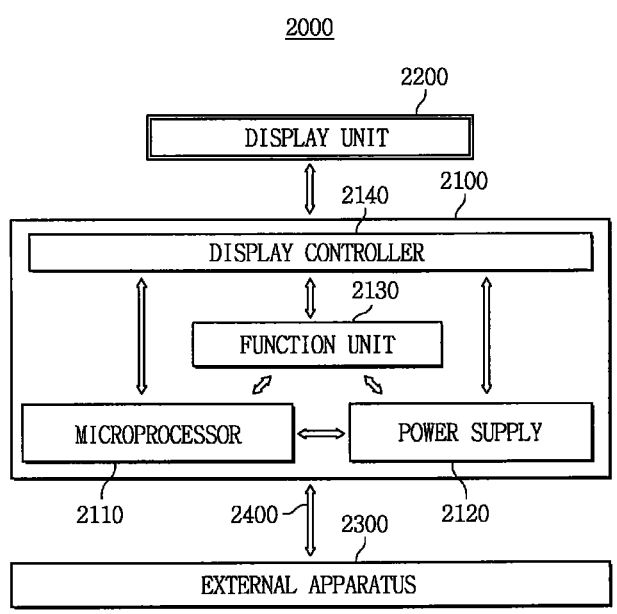
FIG. 25 is a block diagram showing a mobile system including the semiconductor device according to embodiments of the inventive concept.

FIG. 25 is a block diagram showing a mobile system including the semiconductor device according to embodiments of inventive concept.

Referring to FIG. 25, the mobile system 2000 may include a body unit 2100, a display unit 2200, and an external apparatus 2300. The body unit 2100 may include a microprocessor 2110, a power supply 2120, a function unit 2130, and a display controller 2140.

The body unit 2100 may include a system board or a motherboard including a printed circuit board (PCB). The microprocessor 2110, the power supply 2120, the function unit 2130, and the display controller 2140 may be mounted or disposed on the body unit 2100.

The microprocessor 2110 may receive a voltage from the power supply 2120 to control the function unit 2130 and the display controller 2140. The power supply 2120 may receive a constant voltage from an external power supply, divide the voltage into various voltage levels, and supply the voltages to the microprocessor 2110, the function unit 2130, the display controller 2140, etc.

The power supply 2120 may include a power management IC (PMIC). The PMIC may efficiently supply a voltage to the microprocessor 2110, the function unit 2130, the display controller 2140, etc.

The function unit 2130 may perform various functions of the mobile system 2000. For example, the function unit 2130 may include various components to perform wireless communication functions such as video output to the display unit 2200 or voice output to a speaker through dialing or communication with the external apparatus 2300. For example, the function unit 2130 may serve as an image processor of a camera.

When the mobile system 2000 is connected to a memory card to expand the capacity, the function unit 2130, may serve as a memory card controller. When the mobile system 2000 further includes a Universal Serial Bus (USB) to expand the functions, the function unit 2130, may serve as an interface controller.

The display unit 2200 may be electrically connected to the body unit 2100. For example, the display unit 2200 may be electrically connected to the display controller 2140 of the body unit 2100. The display unit 2200 may display an image processed by the display controller 2140 of the body unit 2100.

The microprocessor 2110 and the function unit 2130 included in the body unit 2100 may include semiconductor devices according to embodiments of the inventive concept. Therefore, in the mobile system 2000 according to embodiments of the inventive concept, an electrical characteristic may be improved.

Figure 26:
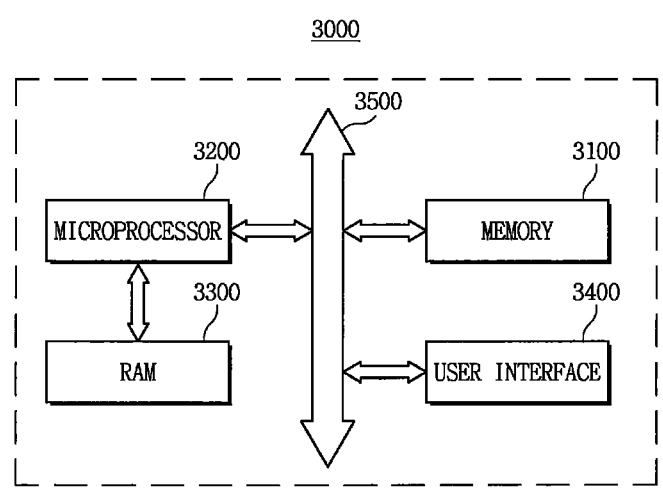
FIG. 26 is a block diagram showing an electronic system including the semiconductor device according to embodiments of the inventive concept.

FIG. 26 is a block diagram showing an electronic system including semiconductor devices according to embodiments of the inventive concept.

Referring to FIG. 26, the electronic system 3000 may include a memory 3100, a microprocessor 3200, a random access memory (RAM) 3300, and a user interface 3400. The electronic system 3000 may be a system of a LED lighting device, a refrigerator, an air conditioner, an industrial cutter, a welding device, an automobile, a ship, an aircraft, a satellite, etc.

The memory 3100 may store codes for booting of the microprocessor 3200, data processed by the microprocessor 3200, or data received from outside the system 3000. The memory 3100 may include a controller.

The microprocessor 3200 may program and control the electronic system 3000. The RAM 3300 may be used as an operational memory of the microprocessor 3200.

The user interface 3400 may perform data communication using a bus 3500. The user interface 3400 may be used to input/output data to/from the electronic system 3000.

The memory 3100, the microprocessor 3200, and the RAM 3300 may include semiconductor devices according to embodiments of the inventive concept. Therefore, in the electronic system 3000 according to embodiments of the inventive concept, an electrical characteristic may be improved.

In the semiconductor device according to embodiments of the inventive concept, the fin body and the epitaxial layer may have a structure in which an electrical characteristic is improved. Therefore, in the semiconductor device according to embodiments of the inventive concept, an electrical characteristic can be improved. Further, in the semiconductor device according to embodiments of the inventive concept, reliability can be improved.

Although a few embodiments have been described with reference to the accompanying drawings, those skilled in the art will readily appreciate that many modifications are possible in embodiments without departing from the scope of the inventive concept and without changing essential features. Therefore, the above-described embodiments should be considered in a descriptive sense only and not for purposes of limitation.

What is claimed:

1. A semiconductor device, comprising:
   a fin body protruding from a substrate;
   an isolation layer on the substrate covering a lower portion of the fin body and exposing an upper portion of the fin body; and
   an epitaxial layer covering the upper portion of the fin body, wherein the epitaxial layer has a surface profile including an hourglass neck shape.

2. The device of claim 1, wherein the upper portion of the fin body includes a lower body portion and an upper body portion having different lattice structures, wherein a level of an upper surface of the lower body portion is higher than a level of an upper surface of the isolation layer.

3. The device of claim 1, wherein the epitaxial layer includes a first concave portion facing outward on a first side surface of the fin body, and a second concave portion facing outward on a second side surface of the fin body opposite to the first side surface, wherein a lowermost level of the second concave portion is higher than a lowermost level of the first concave portion.

4. The device of claim 3, wherein a vertical length of the second concave portion is less than a vertical length of the first concave portion.

5. The device of claim 3, wherein an uppermost level of the second concave portion is equal to an uppermost level of the first concave portion.

6. The device of claim 3, wherein the substrate further includes a first trench adjacent to the first side surface of the fin body and a second trench adjacent to the second side surface of the fin body, wherein a horizontal width of the second trench is less than a horizontal width of the first trench.

7. A semiconductor device, comprising:
   a fin body including a lower body portion and an upper body portion having respective lattice structures that are different from one another;
   an epitaxial layer on the fin body, the epitaxial layer including a first side layer on a first side surface of the fin body;
   wherein the first side layer includes a lower convex portion disposed on the lower body portion and facing outward from the first side surface, an upper convex portion disposed on the upper body portion and facing outward, and a concave portion disposed between the lower convex portion and the upper convex portion and facing outward.

8. The device of claim 7, wherein a surface profile of the first side layer defined by the lower convex portion, the upper convex portion, and the concave portion has a wave shape.

9. The device of claim 7, wherein a surface profile defined by the lower convex portion is different from a surface profile defined by the upper convex portion.

10. The device of claim 9, wherein a vertical length of the lower convex portion is less than a vertical length of the upper convex portion.

11. The device of claim 9, wherein a maximum horizontal length of the lower convex portion is less than a maximum horizontal length of the upper convex portion.

12. The device of claim 7, further comprising:
    a second side layer on a second side surface of the fin body opposite the first side surface of the fin body, wherein a surface profile of the second side layer is different from a surface profile of the first side layer.

13. The device of claim 12, wherein a lowermost level of the second side layer is higher than a lowermost level of the first side layer.

14. The device of claim 13, wherein the lowermost level of the second side layer is disposed in the concave portion of the first side layer.

15. The device of claim 13, wherein the surface profile of the second side layer has a convex shape facing outward from the fin body.

16. A semiconductor device, comprising:
    a fin body including a body shoulder portion disposed on an upper sidewall surface of the fin body;
    an epitaxial layer covering the body shoulder portion, wherein the epitaxial layer includes a concave portion facing outward from the fin body adjacent to the body shoulder portion of the fin body;
    wherein the body shoulder portion comprises a first body shoulder portion on a first upper sidewall surface and wherein a lowermost level of the first body shoulder portion is lower than a lowermost level of a second body shoulder portion on a second upper sidewall surface that is opposite the first upper sidewall surface;
    a first isolation layer disposed on a lower portion of the first upper sidewall surface;
    a second isolation layer disposed on a lower portion of the second upper sidewall surface, wherein a level of an upper surface of the second isolation layer is higher than a level of an upper surface of the first isolation layer;
    wherein the level of the upper surface of the first isolation layer is lower than the lowermost level of the first body shoulder portion; and
    the level of the upper surface of the second isolation layer is lower than the lowermost level of the second body shoulder portion.

17. The device of claim 16, wherein a horizontal width of the second isolation layer is less than a horizontal width of the first isolation layer.

* * * * *